US009350930B2

(12) United States Patent
Lee et al.

(10) Patent No.: US 9,350,930 B2
(45) Date of Patent: May 24, 2016

(54) UNIT PIXEL OF STACKED IMAGE SENSOR AND STACKED IMAGE SENSOR INCLUDING THE SAME

(71) Applicant: Samsung Electronics Co., Ltd., Suwon-Si, Gyeonggi-Do (KR)

(72) Inventors: Tae-Yon Lee, Seoul (KR); Yibing Michelle Wang, Temple City, CA (US); Gwi-deok Ryan Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 107 days.

(21) Appl. No.: 14/453,124

(22) Filed: Aug. 6, 2014

(65) Prior Publication Data

US 2015/0187844 A1 Jul. 2, 2015

(30) Foreign Application Priority Data

Dec. 30, 2013 (KR) ........................ 10-2013-0167312

(51) Int. Cl.
*H01L 27/00* (2006.01)
*H04N 5/378* (2011.01)
*H01L 27/146* (2006.01)

(52) U.S. Cl.
CPC .......... *H04N 5/378* (2013.01); *H01L 27/14609* (2013.01); *H01L 27/14627* (2013.01); *H01L 27/14641* (2013.01); *H01L 27/14643* (2013.01); *H01L 27/14665* (2013.01)

(58) Field of Classification Search
CPC ............ H01L 27/146; H01L 27/14647; H01L 27/14652; H04N 5/378
USPC ........ 250/208.1, 214.1, 214 R; 257/291, 292; 348/303, 308, 320, 322
See application file for complete search history.

(56) References Cited

U.S. PATENT DOCUMENTS

| 7,399,216 | B2 | 7/2008 | Mateo |
| 7,416,677 | B2 | 8/2008 | Takahashi |
| 7,948,545 | B2 | 5/2011 | Suzuki |
| 8,035,708 | B2 | 10/2011 | Takizawa et al. |
| 8,274,587 | B2 | 9/2012 | Hynecek |
| 8,476,573 | B2 | 7/2013 | Yamashita |
| 8,508,628 | B2 | 8/2013 | Yamaguchi |

(Continued)

FOREIGN PATENT DOCUMENTS

| JP | 2007208840 A | 8/2007 |
| JP | 2007329161 A | 12/2007 |

(Continued)

*Primary Examiner* — Kevin Pyo
(74) *Attorney, Agent, or Firm* — Harness, Dickey & Pierce, P.L.C.

(57) ABSTRACT

A unit pixel of a stacked image sensor includes a stacked photoelectric conversion unit, a first and second signal generating units. The stacked photoelectric conversion unit includes first, second and third photoelectric conversion elements that are stacked on each other. The first, second and third photoelectric conversion elements collect first, second and third photocharges based on first, second and third components of incident light. The first signal generating unit generates a first pixel signal based on the first photocharges and a first signal node and generates a second pixel signal based on the second photocharges and the first signal node. The second signal generating unit generates a third pixel signal based on the third photocharges and a second signal node. At least a portion of the second signal generating unit is shared by the first signal generating unit.

20 Claims, 14 Drawing Sheets

(56) References Cited

U.S. PATENT DOCUMENTS

| | | |
|---|---|---|
| 8,624,305 B2 | 1/2014 | Okita et al. |
| 2007/0012955 A1 | 1/2007 | Ihama |
| 2009/0160981 A1 | 6/2009 | Baumgartner et al. |
| 2010/0177222 A1 | 7/2010 | Matsumoto |
| 2011/0205408 A1 | 8/2011 | Suzuki |
| 2013/0002917 A1 | 1/2013 | Oike |
| 2013/0033628 A1 | 2/2013 | Yamaguchi |
| 2013/0093911 A1 | 4/2013 | Sul et al. |
| 2015/0029365 A1* | 1/2015 | Lee ................. H04N 9/045 348/272 |
| 2015/0221702 A1* | 8/2015 | Jung .................. H01L 27/307 257/40 |

FOREIGN PATENT DOCUMENTS

| | | |
|---|---|---|
| JP | 2008258498 A | 10/2008 |
| JP | 2011029337 A | 2/2011 |
| JP | 2011129873 A | 2/2011 |
| JP | 5132640 B2 | 1/2013 |
| KR | 20050085685 A | 8/2005 |
| KR | 20070116748 A | 12/2007 |
| KR | 100791752 B1 | 1/2008 |
| KR | 20100087633 A | 8/2010 |
| KR | 20110036995 A | 4/2011 |
| KR | 101067303 B1 | 9/2011 |
| KR | 20130041418 A | 4/2013 |

* cited by examiner

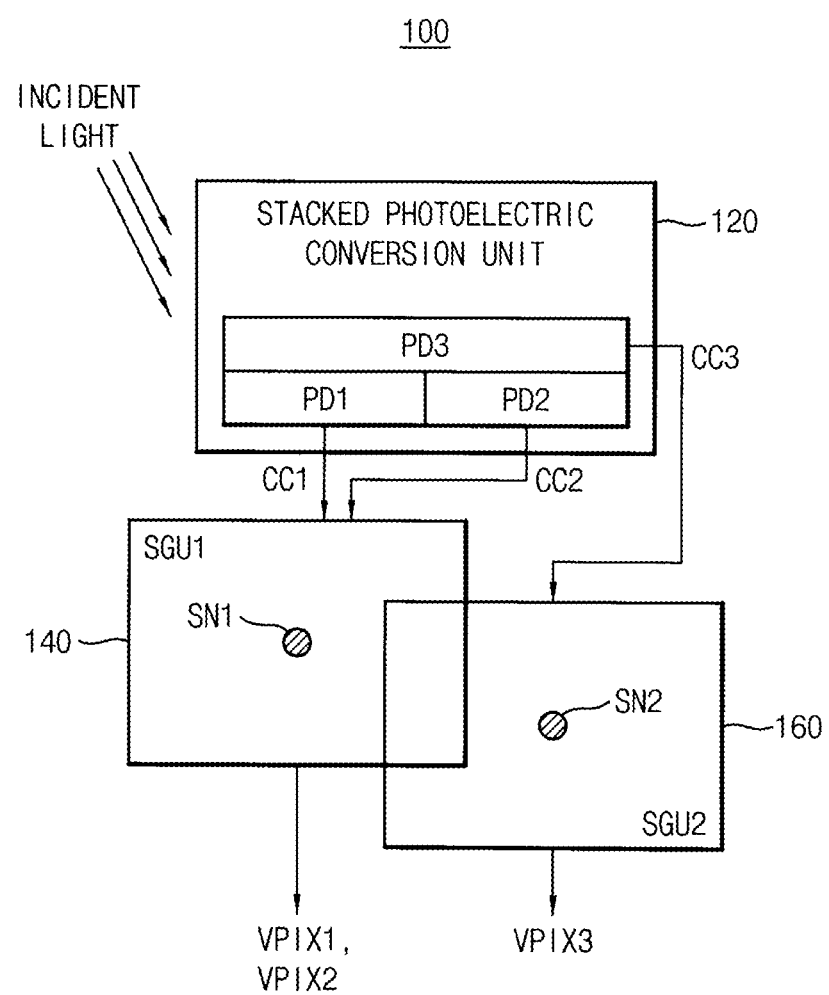

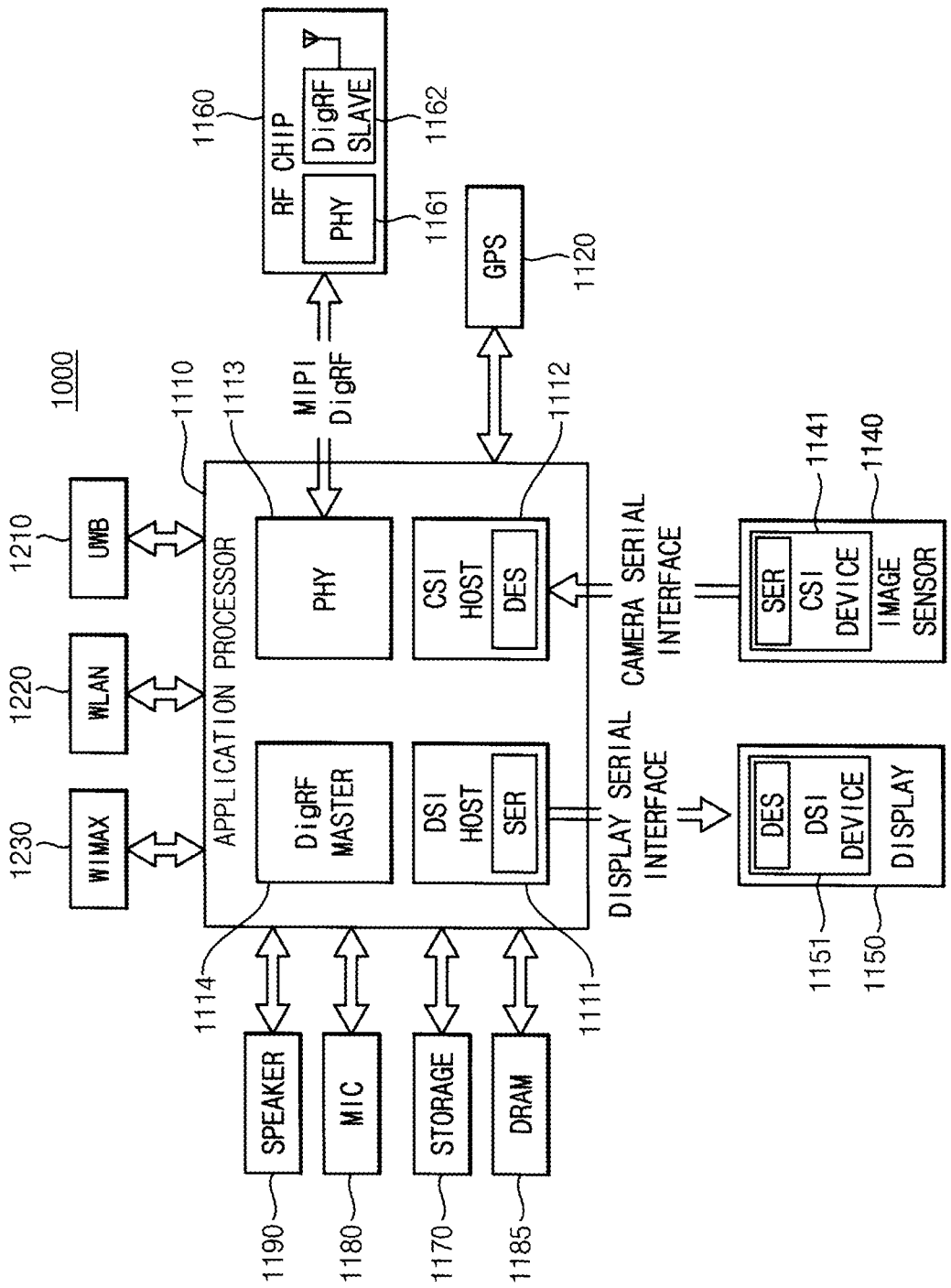

UNIT PIXEL OF STACKED IMAGE SENSOR AND STACKED IMAGE SENSOR INCLUDING THE SAME

CROSS-REFERENCE TO RELATED APPLICATION

This application claims priority under 35 USC §119 to Korean Patent Application No. 2013-0167312, filed on Dec. 30, 2013 in the Korean Intellectual Property Office (KIPO), the contents of which are herein incorporated by reference in their entirety.

BACKGROUND

1. Technical Field

Example embodiments relate generally to image sensors, and more particularly to unit pixels of stacked image sensors including stacked photoelectric conversion units and stacked image sensors including the unit pixels.

2. Description of the Related Art

An image sensor is a semiconductor device that transforms incident light into an electric signal (e.g., performs photoelectric transformation) to provide image information corresponding to the incident light. A unit pixel of the image sensor may include a photoelectric conversion unit for transforming the incident light into the electric signal. To simultaneously or concurrently detect light signals having various wavelengths (e.g., various colors) from the incident light, a unit pixel including a stacked photoelectric conversion unit and a stacked image sensor including the unit pixel have been proposed. The stacked photoelectric conversion unit may include a plurality of photoelectric conversion elements that are stacked on each other.

SUMMARY

Accordingly, the inventive concepts are provided to substantially obviate one or more problems due to limitations and disadvantages of the related art.

Some example embodiments provide a unit pixel of a stacked image sensor capable of having a relatively great fill factor.

Some example embodiments provide a stacked image sensor including the unit pixel.

According to some example embodiments, a unit pixel of a stacked image sensor includes a stacked photoelectric conversion unit, a first signal generating unit and a second signal generating unit. The stacked photoelectric conversion unit includes a first photoelectric conversion element, a second photoelectric conversion element and a third photoelectric conversion element that are stacked on each other. The first photoelectric conversion element collects first photocharges based on a first component of incident light. The second photoelectric conversion element collects second photocharges based on a second component of the incident light. The third photoelectric conversion element collects third photocharges based on a third component of the incident light. The first signal generating unit generates a first pixel signal based on the first photocharges and a first signal node, and generates a second pixel signal based on the second photocharges and the first signal node. The second signal generating unit generates a third pixel signal based on the third photocharges and a second signal node. At least a portion of the second signal generating unit is shared by the first signal generating unit.

In an example embodiment, the first signal generating unit may include a first transfer transistor, a second transfer transistor, a first reset transistor and a first drive transistor. The second signal generating unit may include a second reset transistor, a second drive transistor and a selection transistor. A row selection signal may be commonly applied to a first terminal of the first reset transistor and a control terminal of the selection transistor. Outputs of the first, second and third pixel signals may be controlled based on the row selection signal.

The first transfer transistor may transfer the first photocharges to the first signal node in response to a first transfer signal, the second transfer transistor may transfer the second photocharges to the first signal node in response to a second transfer signal, the first reset transistor may reset the first signal node in response to a first reset signal and the row selection signal, and the first drive transistor may output the first and second pixel signals by amplifying a voltage at the first signal node. The second reset transistor may reset the second signal node in response to a second reset signal, the second drive transistor may amplify a voltage at the second signal node, and the selection transistor may output the third pixel signal based on the amplified voltage at the second signal node and the row selection signal.

In an example embodiment, a selection transistor may be shared by the first and second signal generating units. The selection transistor may control outputs of the first, second and third pixel signals based on a row selection signal applied to a control terminal of the selection transistor.

The first signal generating unit may include a first transfer transistor, a second transfer transistor, a first reset transistor and a first drive transistor. The second signal generating unit may include a second reset transistor and a second drive transistor.

The selection transistor may be selectively turned on in response to the row selection signal, the first transfer transistor may transfer the first photocharges to the first signal node in response to a first transfer signal, the second transfer transistor may transfer the second photocharges to the first signal node in response to a second transfer signal, the first reset transistor may reset the first signal node in response to a first reset signal, and the first drive transistor may output the first and second pixel signals by amplifying a voltage at the first signal node when the selection transistor is turned on. The second reset transistor may reset the second signal node in response to a second reset signal, and the second drive transistor may output the third pixel signal by amplifying a voltage at the second signal node when the selection transistor is turned on.

In an example embodiment, the first and second photocharges may correspond to electrons of electron-hole pairs, and the third photocharges may correspond to holes of the electron-hole pairs.

The third photoelectric conversion element may be an organic photoelectric conversion element that includes a first electrode, an organic photoelectric conversion layer on the first electrode and a second electrode on the organic photoelectric conversion layer. A negative voltage may be applied to the first electrode, a positive voltage may be applied to the second electrode, a power supply voltage may be applied to a first terminal of the first reset transistor and a first terminal of the selection transistor, and a voltage lower than the power supply voltage may be applied to a first terminal of the second reset transistor.

In an example embodiment, the first, second and third photocharges may correspond to electrons of electron-hole pairs. The third photoelectric conversion element may be an organic photoelectric conversion element that includes a first electrode, an organic photoelectric conversion layer on the first electrode and a second electrode on the organic photoelectric conversion layer. A positive voltage may be applied to the first electrode, a negative voltage may be applied to the second electrode, and a power supply voltage may be applied to a first terminal of the first reset transistor, a first terminal of the selection transistor, and a first terminal of the second reset transistor.

In an example embodiment, the second signal generating unit may further include a feedback unit. The feedback unit may have a first input terminal receiving the third pixel signal, a second input terminal receiving a reference signal and an output terminal connected to a first terminal of the second reset transistor.

In an example embodiment, the second signal generating unit may further include a feedback unit and a first transistor. The feedback unit may have a first input terminal receiving the third pixel signal, a second input terminal receiving a reference signal and an output terminal. The first transistor may selectively connect the output terminal of the feedback unit with a control terminal of the second reset transistor.

The first signal generating unit may generate the first and second pixel signals by amplifying a voltage at the first signal node, the first signal node may be selectively connected to one of the first and second photoelectric conversion elements through a respective one of first and second transfer transistors. The second signal generating unit may generate the third pixel signal by amplifying a voltage at the second signal node, the second signal node may be directly connected to the third photoelectric conversion element.

In an example embodiment, the first and second photoelectric conversion elements may be formed within a semiconductor substrate, and the third photoelectric conversion element may be formed over the semiconductor substrate.

In an example embodiment, the first component of the incident light may be a red component, the second component of the incident light may be a blue component, and the third component of the incident light may be a green component.

According to some example embodiments, a unit pixel of a stacked image sensor includes a stacked photoelectric conversion unit, a first signal generating unit and a second signal generating unit. The stacked photoelectric conversion unit independently collects first photocharges, second photocharges and third photocharges based on different components of incident light. The first signal generating unit includes a first signal node and structures sequentially transferring the first and second photocharges to the first signal node. The first signal generating unit generates a first pixel signal based on the first photocharges transferred to the first signal node and generates a second pixel signal based on the second photocharges transferred to the first signal node. The second signal generating unit includes a second signal node directly receiving the third photocharges. The second signal generating unit generates a third pixel signal based on the third photocharges and the second signal node. A configuration of activating the unit pixel based on a row selection signal is shared by the first and second signal generating units.

In an example embodiment, the first signal generating unit may include a reset transistor resetting the first signal node, and the second signal generating unit may include a selection transistor outputting the third pixel signal. The row selection signal may be commonly applied to a first terminal of the reset transistor and a control terminal of the selection transistor.

In an example embodiment, the unit pixel may further include a selection transistor. The selection transistor may have a control terminal receiving the row selection signal and sequentially outputting the first, second and third pixel signals based on the row selection signal. The selection transistor may be shared by the first and second signal generating units.

According to some example embodiments, a stacked image sensor includes a pixel array and a signal processing unit. The pixel array includes a plurality of unit pixels and generates a plurality of pixel signals based on incident light. The signal processing unit generates image data based on the plurality of pixel signals. Each of the plurality of unit pixels includes a stacked photoelectric conversion unit, a first signal generating unit and a second signal generating unit. The stacked photoelectric conversion unit includes a first photoelectric conversion element, a second photoelectric conversion element and a third photoelectric conversion element that are stacked on each other. The first photoelectric conversion element collects first photocharges based on a first component of the incident light. The second photoelectric conversion element collects second photocharges based on a second component of the incident light. The third photoelectric conversion element collects third photocharges based on a third component of the incident light. The first signal generating unit generates a first pixel signal based on the first photocharges and a first signal node, and generates a second pixel signal based on the second photocharges and the first signal node. The second signal generating unit generates a third pixel signal based on the third photocharges and a second signal node. At least a portion of the second signal generating unit is shared by the first signal generating unit.

In an example embodiment, the signal processing unit may include an analog-to-digital converting (ADC) unit that performs an ADC on the plurality of pixel signals. The ADC unit may include a correlated double sampling (CDS) unit. The CDS unit may sequentially perform a CDS on the first, second and third pixel signals.

In an example embodiment, the signal processing unit may include an ADC unit that performs an ADC on the plurality of pixel signals. The ADC unit may include a first CDS unit and a second CDS unit. The first CDS unit may sequentially perform a CDS on the first and second pixel signals. The second CDS unit may perform the CDS on the third pixel signal.

Accordingly, the unit pixel of the stacked image sensor according to some example embodiments may include the stacked photoelectric conversion unit, the first signal generating unit performing a 4T operation and the second signal generating unit performing a 3T operation. At least a portion of the second signal generating unit may be shared by the first signal generating unit. Thus, the unit pixel may have a relatively great fill factor, and the stacked image sensor including the unit pixel may have relatively high light guiding efficiency and light sensitivity.

BRIEF DESCRIPTION OF THE DRAWINGS

Illustrative, non-limiting example embodiments will be more clearly understood from the following detailed description taken in conjunction with the accompanying drawings.

FIG. 1 is a block diagram illustrating a unit pixel of a stacked image sensor according to some example embodiments.

FIG. 15 is a block diagram illustrating an example of an interface employable in the computing system of FIG. 14.

DETAILED DESCRIPTION OF EXAMPLE EMBODIMENTS

Figure 2A:
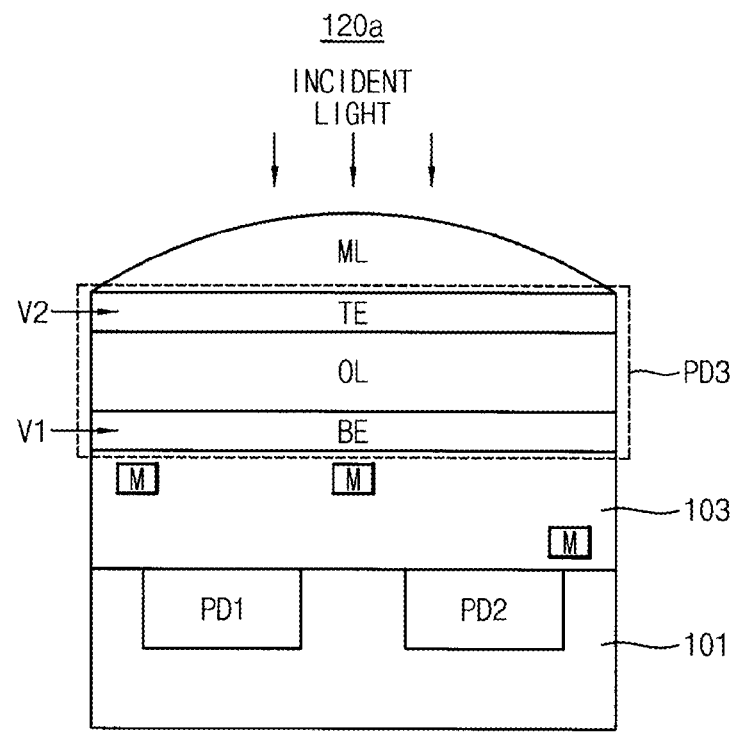
FIGS. 2A, 2B and 2C are cross-sectional views illustrating examples of a stacked photoelectric conversion unit included in the unit pixel of FIG. 1.

Various example embodiments will be described more fully with reference to the accompanying drawings, in which example embodiments are shown. These inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a unit pixel of a stacked image sensor according to some example embodiments.

Referring to FIG. 1, a unit pixel 100 of a stacked image sensor includes a stacked photoelectric conversion unit 120, a first signal generating unit 140 and a second signal generating unit 160.

The stacked photoelectric conversion unit 120 includes a first photoelectric conversion element PD1, a second photoelectric conversion element PD2 and a third photoelectric conversion element PD3 that are stacked on each other. The first photoelectric conversion element PD1 collects or generates first photocharges CC1 based on a first component of incident light. The second photoelectric conversion element PD2 collects or generates second photocharges CC2 based on a second component of the incident light. The third photoelectric conversion element PD3 collects or generates third photocharges CC3 based on a third component of the incident light. In some example embodiments, the first component of the incident light may be a red component, the second component of the incident light may be a blue component, and the third component of the incident light may be a green component. In other words, the stacked photoelectric conversion unit 120 independently collects or generates the first photocharges CC1, the second photocharges CC2 and the third photocharges CC3 based on different components of the incident light.

The first signal generating unit 140 generates a first pixel signal VPIX1 based on the first photocharges CC1 and a first signal node SN1 and generates a second pixel signal VPIX2 based on the second photocharges CC2 and the first signal node SN1. The second signal generating unit 160 generates a third pixel signal VPIX3 based on the third photocharges CC3 and a second signal node SN2. The first signal node SN1 generating the first and second pixel signals VPIX1 and VPIX2 and the second signal node SN2 generating the third pixel signal VPIX3 may be separated from each other.

As will be described below with reference to FIGS. 3 and 5, the first signal generating unit 140 may include the first signal node SN1 and structures (e.g., transfer transistors) sequentially transferring the first and second photocharges CC1 and CC2 to the first signal node SN1. The first signal generating unit 140 may generate the first pixel signal VPIX1 based on the first photocharges CC1 transferred to the first signal node SN1 and may generate the second pixel signal VPIX2 based on the second photocharges CC2 transferred to the first signal node SN1. A correlated double sampling (CDS) may be performed on the first and second pixel signals VPIX1 and VPIX2. However, the second signal generating unit 160 may not include a structure (e.g., a transfer transistor) transferring the third photocharges CC3 to the second signal node SN2, and the second signal node SN2 may be directly connected to the third photoelectric conversion element PD3. In other words, the second signal generating unit 160 may include the second signal node SN2 directly receiving the third photocharges CC3. The CDS may be performed on the third pixel signal VPIX3 based on a 3T operation.

At least a portion of the second signal generating unit 160 is shared by the first signal generating unit 140. For example, as will be described below with reference to FIGS. 12 and 13, a stacked image sensor according to some example embodiments may include a pixel array (e.g., an element 210 in FIGS. 12 and 13), and the pixel array may include a plurality of unit pixels that are arranged in a matrix of a plurality of rows and a plurality of columns. Each of the plurality of unit pixels may be substantially the same as the unit pixel 100 of FIG. 1. In the stacked image sensor, one of the plurality of rows may be selected based on a row selection signal, and image data may be generated by processing pixel signals that are generated from unit pixels disposed in the selected row. A configuration of activating the unit pixel 100 based on the row selection signal may be shared by the first and second signal generating units 140 and 160.

In some example embodiments, as will be described below with reference to FIG. 3, the first signal generating unit 140 may include a reset transistor, the second signal generating unit 160 may include a selection transistor, and the row selection signal may be commonly applied to a first terminal (e.g., a drain terminal) of the reset transistor and a control terminal (e.g., a gate terminal) of the selection transistor. In other example embodiments, as will be described below with reference to FIG. 5, the row selection signal may be commonly applied to a control terminal (e.g., a gate terminal) of a selection transistor, and the selection transistor may be shared by the first and second signal generating units 140 and 160.

In the unit pixel of the stacked image sensor according to some example embodiments, although the first signal node SN1 in the first signal generating unit 140 generating the first and second pixel signals VPIX1 and VPIX2 and the second signal node SN2 in the second signal generating unit 160 generating the third pixel signal VPIX3 are separated from each other, at least the portion of the second signal generating unit 160 may be shared by the first signal generating unit 140. Accordingly, sizes of the first and second signal generating units 140 and 160 may be reduced, a size of the stacked photoelectric conversion unit 120 may be increased, and thus the unit pixel 100 may have a relatively great fill factor, which represents a ratio of a photoelectric conversion area to a whole unit pixel area.

Figure 2B:
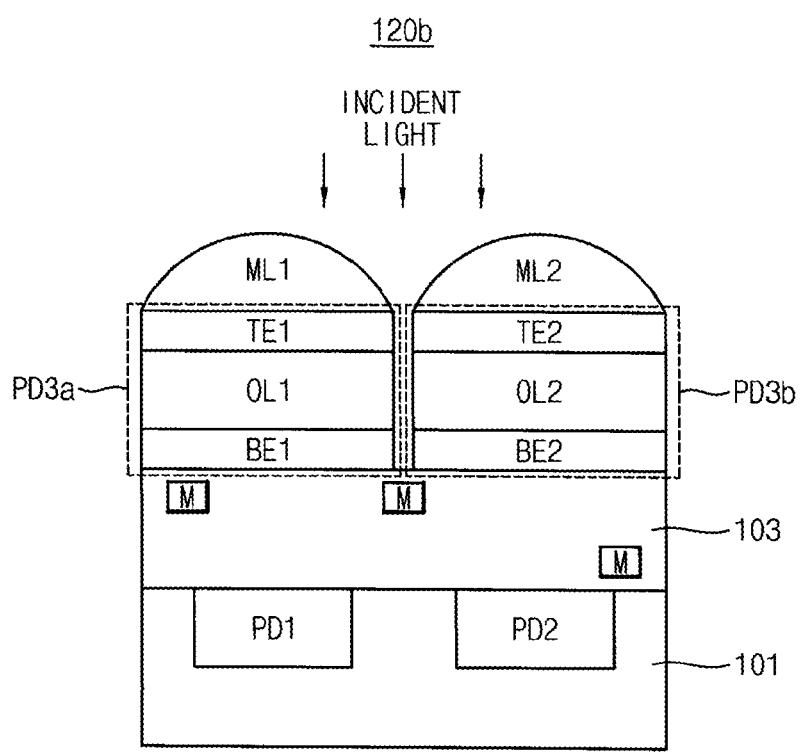
Figure 2C:
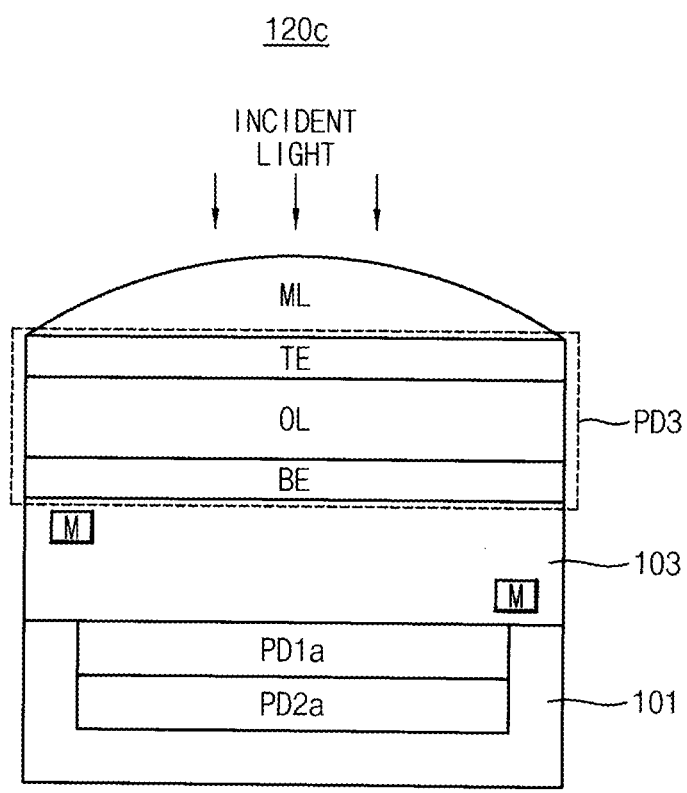

FIGS. 2A, 2B and 2C are cross-sectional views illustrating examples of a stacked photoelectric conversion unit included in the unit pixel of FIG. 1.

Referring to FIG. 2A, a stacked photoelectric conversion unit 120a includes a first photoelectric conversion element PD1, a second photoelectric conversion element PD2 and a third photoelectric conversion element PD3. The first and second photoelectric conversion elements PD1 and PD2 may be formed within a semiconductor substrate 101, and the third photoelectric conversion element PD3 may be formed over the semiconductor substrate 101.

The semiconductor substrate 101 may include an epitaxial layer. Impurities included in the semiconductor substrate 101 may have a conductive type different from a conductive type of impurities included in the first and second photoelectric conversion elements PD1 and PD2. For example, the semiconductor substrate 101 may be doped with p-type impurities, and the first and second photoelectric conversion elements PD1 and PD2 may be formed by doping with n-type impurities in the semiconductor substrate 101 using, e.g., an ion implantation process. The first and second photoelectric conversion elements PD1 and PD2 may be formed of silicon (Si) or germanium (Ge) and may include a photo diode, a photo transistor, a photo gate, a pinned photo diode (PPD) and/or a combination thereof.

In some example embodiments, when the first and second photoelectric conversion elements PD1 and PD2 are formed by doping with n-type impurities in a p-type semiconductor substrate, the first and second photoelectric conversion elements PD1 and PD2 may collect electrons of electron-hole pairs. In other example embodiments, when the first and second photoelectric conversion elements PD1 and PD2 are formed by doping with p-type impurities in a n-type semiconductor substrate, the first and second photoelectric conversion elements PD1 and PD2 may collect holes of electron-hole pairs.

A dielectric layer 103 may be formed on the semiconductor substrate 101. For example, the dielectric layer 103 may be formed of at least one material selected from the group consisting of silicon oxide (SiOx), silicon oxynitride (SiOxNy), silicon nitride (SiNx), germanium oxynitride (GeOxNy), germanium silicon oxide (GeSixOy), and high-k dielectric materials (e.g., hafnium oxide (HfOx), zirconium oxide (ZrOx), aluminum oxide (AlOx), tantalum oxide (TaOx), hafnium silicate (HfSix), and zirconium silicate (ZrSix)). The dielectric layer 103 may include gate structures M and a plurality of metal wires (not illustrated) having a multi-layer structure. The gate structures M may constitute transistors included in the first and second signal generating units 140 and 160 in FIG. 1. The plurality of metal wires may electrically connect the transistors and/or the photoelectric conversion elements PD1, PD2 and PD3 with each other.

The third photoelectric conversion element PD3 may be formed on the dielectric layer 103. The third photoelectric conversion element PD3 may be an organic photoelectric conversion element. The third photoelectric conversion element PD3 may include a first electrode BE (e.g., a bottom electrode), an organic photoelectric conversion layer OL and a second electrode TE (e.g., a top electrode). The first electrode BE may be formed on the dielectric layer 103, the organic photoelectric conversion layer OL may be formed on the first electrode BE, and the second electrode TE may be formed on the organic photoelectric conversion layer OL. For example, the organic photoelectric conversion layer OL may be formed of non-silicon (non-Si) or amorphous silicon (a-Si), such as organic semiconductor, quantum dot, chalcogenide, etc. The organic photoelectric conversion layer OL may include a photo diode, a photo transistor, a photo gate, a pinned photo diode (PPD) and/or a combination thereof. A first voltage V1 may be applied to the first electrode BE, and a second voltage V2 may be applied to the second electrode TE.

In some example embodiments, when a level of the first voltage V1 is higher than a level of the second voltage V2, e.g., when the first voltage V1 is a positive voltage and the second voltage is a negative voltage, the organic photoelectric conversion layer OL may collect electrons of electron-hole pairs. In other example embodiments, when the level of the first voltage V1 is lower than the level of the second voltage V2, e.g., when the first voltage V1 is a negative voltage and the second voltage is a positive voltage, the organic photoelectric conversion layer OL may collect holes of electron-hole pairs.

The micro lens ML may be formed on the third photoelectric conversion element PD3. The micro lens ML may be optically aligned with the photoelectric conversion elements PD1, PD2 and PD3. In other words, the micro lens ML may focus the incident light entering the micro lens ML onto the first, second and third photoelectric conversion elements PD1, PD2 and PD3.

According to some example embodiments, color filters (not illustrated) may be formed within the dielectric layer 103 such that the color filters are optically aligned with the first and second photoelectric conversion elements PD1 and PD2. For example, a red filter (not illustrated) may be formed within the dielectric layer 103 over the first photoelectric conversion element PD1, and a blue filter (not illustrated) may be formed within the dielectric layer 103 over the second photoelectric conversion element PD2. According to some example embodiments, a planarization layer (not illustrated), e.g., an over-coating layer (OCL), may be formed between the third photoelectric conversion element PD3 and the micro lens ML. Although FIG. 2A illustrates that the incident light passes through a front surface of the semiconductor substrate 101, the incident light may pass through a back surface of the semiconductor substrate 101.

Referring to FIG. 2B, a stacked photoelectric conversion unit 120b includes a first photoelectric conversion element PD1, a second photoelectric conversion element PD2 and third photoelectric conversion elements PD3a and PD3b. The first and second photoelectric conversion elements PD1 and PD2 may be formed within a semiconductor substrate 101, and the third photoelectric conversion elements PD3a and PD3b may be formed over the semiconductor substrate 101.

In comparison with the stacked photoelectric conversion unit 120a of FIG. 2A, the stacked photoelectric conversion unit 120b of FIG. 2B may include two photoelectric conversion elements PD3a and PD3b, e.g., two organic photoelectric conversion elements formed over the semiconductor substrate 101. One element PD3a of the third photoelectric conversion elements PD3a and PD3b may be formed over the semiconductor substrate 101 corresponding to the first photoelectric conversion element PD1, and another one element PD3b of the third photoelectric conversion elements PD3a and PD3b may be formed over the semiconductor substrate 101 corresponding to the second photoelectric conversion element PD2. Each of the third photoelectric conversion elements PD3a and PD3b may include a respective one of first electrodes BE1 and BE2, a respective one of organic photoelectric conversion layers OL1 and OL2 and a respective one of second electrodes TE1 and TE2. Micro lenses ML1 and ML2 may be formed on the third photoelectric conversion elements PD3a and PD3b.

The first and second photoelectric conversion elements PD1 and PD2 in FIG. 2B may be substantially the same as the first and second photoelectric conversion elements PD1 and PD2 in FIG. 2A, respectively. Although not illustrated in FIG. 2B, a first voltage V1 may be applied to the first electrodes BE1 and BE2, and a second voltage V2 may be applied to the second electrodes TE1 and TE2.

Referring to FIG. 2C, a stacked photoelectric conversion unit 120c includes a first photoelectric conversion element PD1a, a second photoelectric conversion element PD2a and a third photoelectric conversion element PD3. The first and second photoelectric conversion elements PD1a and PD2a may be formed within a semiconductor substrate 101, and the third photoelectric conversion element PD3 may be formed over the semiconductor substrate 101.

In comparison with the stacked photoelectric conversion unit 120a of FIG. 2A, the stacked photoelectric conversion unit 120c of FIG. 2C may include the first and second photoelectric conversion elements PD1a and PD2a that are stacked on each other within the semiconductor substrate 101. In other words, both the first and second photoelectric conversion elements PD1 and PD2 in FIG. 2A may be adjacent to a surface of the semiconductor substrate 101 (e.g., both surfaces of the first and second photoelectric conversion elements PD1 and PD2 in FIG. 2A may be coplanar with the surface of the semiconductor substrate 101 in FIG. 2A). Only the first photoelectric conversion element PD1a in FIG. 2C may be adjacent to a surface of the semiconductor substrate 101, and the second photoelectric conversion element PD2a in FIG. 2C may be formed under the first photoelectric conversion element PD1a (e.g., only a surface of the first photoelectric conversion element PD1a in FIG. 2C may be coplanar with the surface of the semiconductor substrate 101 in FIG. 2C). The third photoelectric conversion element PD3 in FIG. 2C may be substantially the same as the third photoelectric conversion element PD3 in FIG. 2A.

Although the examples of the stacked photoelectric conversion unit are described above with reference to FIGS. 2A, 2B and 2C, the stacked photoelectric conversion unit included in the unit pixel according to some example embodiments is not limited thereto. For example, the stacked photoelectric conversion unit may have various structures where at least a portion of the first, second and third photoelectric conversion elements are stacked on each other.

Figure 3:
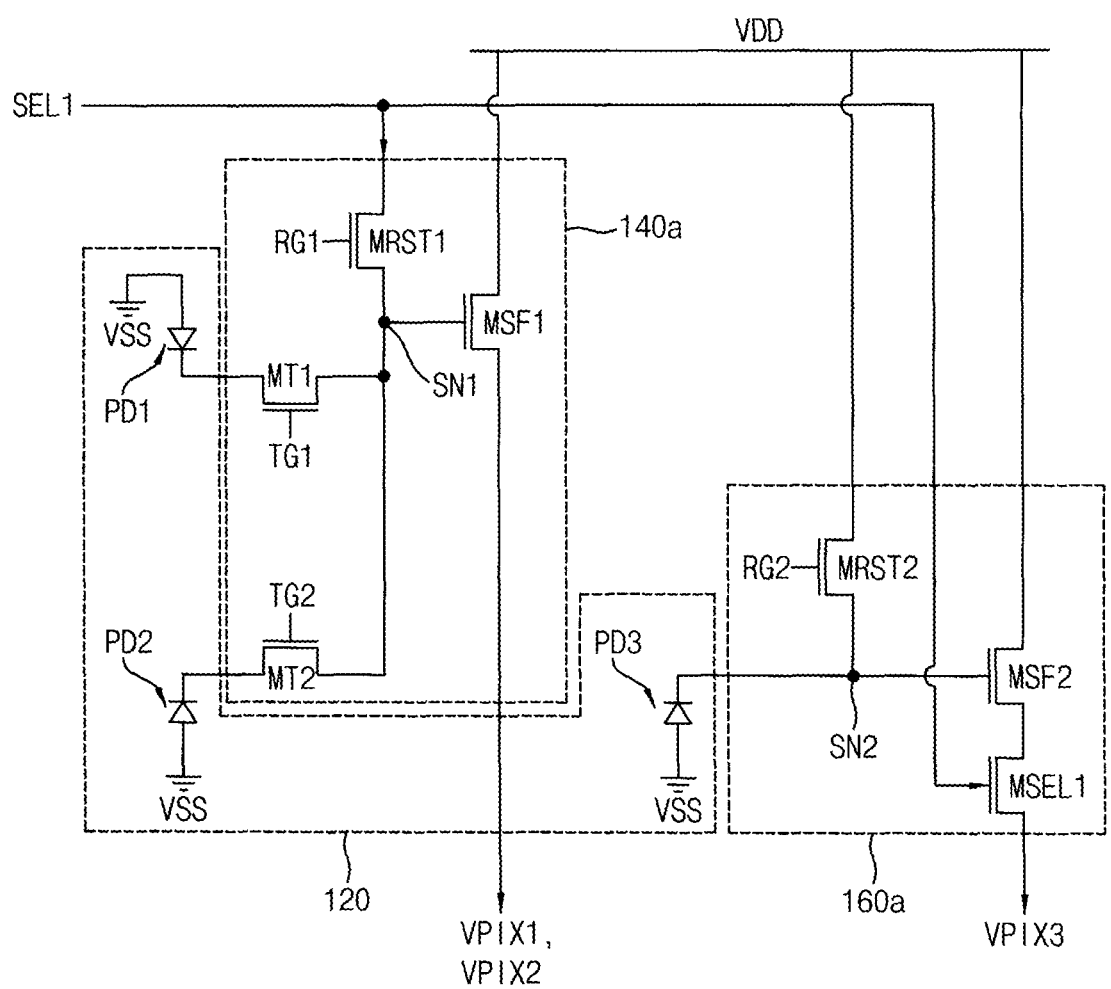
FIG. 3 is a circuit diagram illustrating an example of the unit pixel of FIG. 1.

FIG. 3 is a circuit diagram illustrating an example of the unit pixel of FIG. 1.

Referring to FIG. 3, a unit pixel 100a of a stacked image sensor includes a stacked photoelectric conversion unit 120, a first signal generating unit 140a and a second signal generating unit 160a.

The stacked photoelectric conversion unit 120 includes a first photoelectric conversion element PD1, a second photoelectric conversion element PD2 and a third photoelectric conversion element PD3. The first, second and third photoelectric conversion elements PD1, PD2 and PD3 may be stacked on each other as described above with reference to FIGS. 2A, 2B and 2C. The first photoelectric conversion element PD1 may be connected between a first transfer transistor MT1 and a ground voltage VSS. The second photoelectric conversion element PD2 may be connected between a second transfer transistor MT2 and the ground voltage VSS. The third photoelectric conversion element PD2 may be connected between a second signal node SN2 and the ground voltage VSS.

The first signal generating unit 140a may include a first signal node SN1, the first transfer transistor MT1, the second transfer transistor MT2, a first reset transistor MRST1 and a first drive transistor MSF1. The first signal generating unit 140a may generate the first and second pixel signals VPIX1 and VPIX2 by amplifying a voltage at the first signal node SN1, and the first signal node SN1 may be selectively connected to one of the first and second photoelectric conversion elements PD1 and PD2 through a respective one of the first and second transfer transistors MT1 and MT2. A configuration of the first signal generating unit 140a may be similar to a four-transistor (4T) structure including a transfer transistor, however, may be different from the 4T structure because the first signal generating unit 140a does not include a selection transistor. The configuration of the first signal generating unit 140a may be referred to as a (4T-1T) structure.

The second signal generating unit 160a may include the second signal node SN2, a second reset transistor MRST2, a second drive transistor MSF2 and a first selection transistor MSEL1. The second signal generating unit 160a may generate the third pixel signal VPIX3 by amplifying a voltage at the second signal node SN2 that is directly connected to the third photoelectric conversion element PD3. A configuration of the second signal generating unit 160a may be substantially the same as a three-transistor (3T) structure without a transfer transistor.

In the unit pixel 100a of FIG. 3, a row selection signal SEL1 may be commonly applied to a first terminal of the first reset transistor MRST1 and a control terminal of the first selection transistor MSEL1. As will be described below with reference to FIG. 4, outputs of the first, second and third pixel signals VPIX1, VPIX2 and VPIX3 may be controlled based on the row selection signal MSEL1.

The first transfer transistor MT1 may be connected between the first photoelectric conversion element PD1 and the first signal node SN1 and may have a control terminal receiving a first transfer signal TG1. The second transfer transistor MT2 may be connected between the second photoelectric conversion element PD2 and the first signal node SN1 and may have a control terminal receiving a second transfer signal TG2. The first reset transistor MRST1 may have the first terminal receiving the row selection signal SEL1, a control terminal receiving a first reset signal RG1 and a second terminal connected to the first signal node SN1. The first drive transistor MSF1 may have a first terminal receiving a power supply signal VDD, a control terminal connected to the first signal node SN1 and a second terminal outputting the first and second pixel signals VPIX1 and VPIX2.

The first transfer transistor MT1 may transfer the first photocharges collected by the first photoelectric conversion element PD1 to the first signal node SN1 in response to the first transfer signal TG1. The second transfer transistor MT2 may transfer the second photocharges collected by the second photoelectric conversion element PD2 to the first signal node SN1 in response to the second transfer signal TG2. The first reset transistor MRST1 may reset the first signal node SN1 in response to the first reset signal RG1 and the row selection signal SEL1. The first drive transistor MSF1 may sequentially output the first and second pixel signals VPIX1 and VPIX2 by amplifying the voltage at the first signal node SN1.

The second reset transistor MRST2 may be connected between the power supply voltage VDD and the second signal node SN2 and may have a control terminal receiving a second reset signal RG2. The second drive transistor MSF2 may have a first terminal receiving the power supply signal VDD, a control terminal connected to the second signal node SN2 and a second terminal. The first selection transistor MSEL1 may have a first terminal connected to the second terminal of the second drive transistor MSF2, the control terminal receiving the row selection signal SEL1 and a second terminal outputting the third pixel signal VPIX3.

The second reset transistor MRST2 may reset the second signal node SN2 in response to the second reset signal RG2. The second drive transistor MSF2 may amplifies the voltage at the second signal node SN2. The first selection transistor MSEL1 may output the third pixel signal VPIX3 based on the amplified voltage at the second signal node SN2 and the row selection signal SELL In some example embodiments, the transistors MT1, MT2, MRST1, MSF1, MRST2, MSF2 and MSEL1 included in the first and second signal generating unit 140a and 160a in FIG. 3 may be n-type metal oxide semiconductor (NMOS) transistors. In this case, the first, second and third photocharges collected by the stacked photoelectric conversion unit 120 may be electrons of electron-hole pairs.

Figure 4:
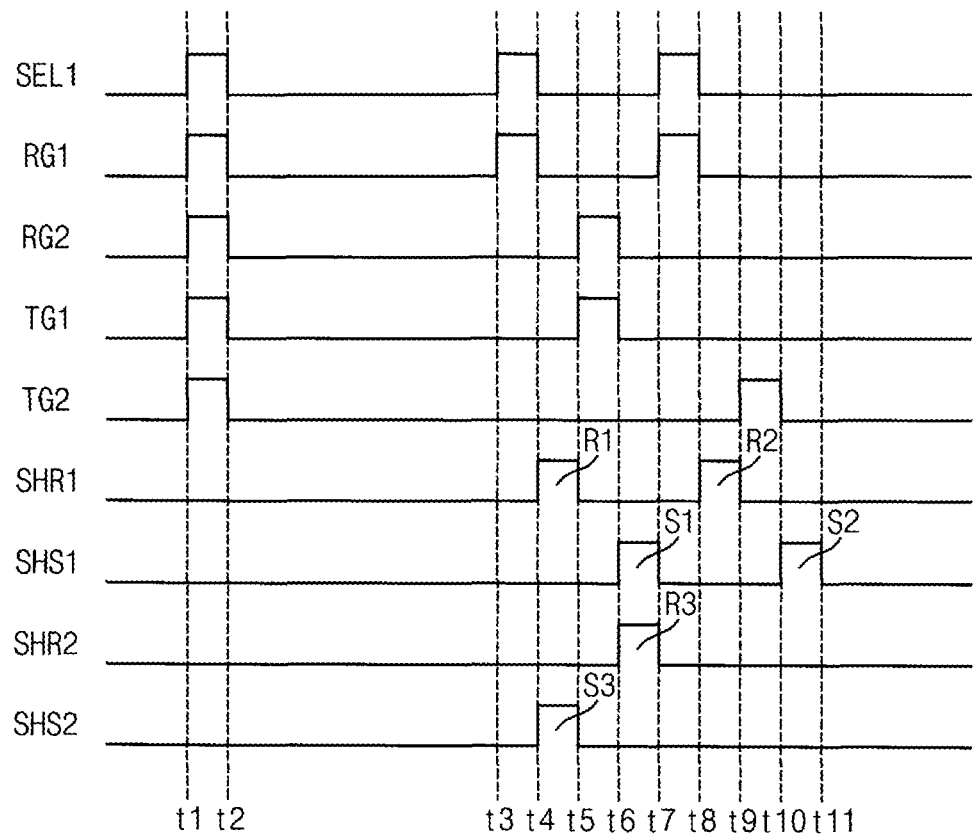
FIG. 4 is a diagram for describing an operation of the unit pixel of FIG. 3.

FIG. 4 is a diagram for describing an operation of the unit pixel of FIG. 3.

Referring to FIGS. 3 and 4, at time t1, the unit pixel 100a starts to operate in an integration mode.

During a period from time t1 to time t2, the row selection signal SEL1, the first and second reset signals RG1 and RG2 and the first and second transfer signals TG1 and TG2 are activated. The first signal node SN1 is reset based on the activated row selection signal SEL1 and the activated first reset signal RG1. The second signal node SN2 is reset based on the activated second reset signal RG2.

After time t2, a photoelectric conversion operation is performed based on the incident light. For example, the first photoelectric conversion element PD1 collects the first photocharges based on the first component of the incident light, the second photoelectric conversion element PD2 collects the second photocharges based on the second component of the incident light, and the third photoelectric conversion element PD3 collects the third photocharges based on the third component of the incident light.

At time t3, the integration mode is finished, and the unit pixel 100a starts to operate in a readout mode.

During a period from time t3 to time t4, the row selection signal SEL1 and the first reset signal RG1 are activated, and then the first signal node SN1 is reset based on the activated row selection signal SEL1 and the activated first reset signal RG1.

During a period from time t4 to time t5, a first sampling signal SHR1 is activated, and then a reset component R1 of the first pixel signal VPIX1 corresponding to the voltage at the reset first signal node SN1 is sampled. In addition, a fourth sampling signal SHS2 is activated, and then an image component S3 of the third pixel signal VPIX3 corresponding to the voltage at the second signal node SN2 is sampled. The voltage at the second signal node SN2 during the period from time t4 to time t5 may correspond to an amount of the third photocharges.

During a period from time t5 to time t6, the second reset signal RG2 is activated, and then the second signal node SN2 is reset based on the activated second reset signal RG2. In addition, the first transfer signal TG1 is activated, and then the first photocharges are transferred from the first photoelectric conversion element PD1 to the first signal node SN1.

During a period from time t6 to time t7, a second sampling signal SHS1 is activated, and then an image component S1 of the first pixel signal VPIX1 corresponding to the voltage at the first signal node SN1 is sampled. The voltage at the first signal node SN1 during the period from time t6 to time t7 may correspond to an amount of the first photocharges. In addition, a third sampling signal SHR2 is activated, and then a reset component R3 of the third pixel signal VPIX3 corresponding to the voltage at the reset second signal node SN2 is sampled.

During a period from time t7 to time t8, the row selection signal SEL1 and the first reset signal RG1 are activated, and then the first signal node SN1 is reset based on the activated row selection signal SEL1 and the activated first reset signal RG1.

During a period from time t8 to time t9, the first sampling signal SHR1 is activated, and then a reset component R2 of the second pixel signal VPIX2 corresponding to the voltage at the reset first signal node SN1 is sampled.

During a period from time t9 to time t10, the second transfer signal TG2 is activated, and then the second photocharges are transferred from the second photoelectric conversion element PD2 to the first signal node SN1.

During a period from time t10 to time t11, the second sampling signal SHS1 is activated, and then an image component S2 of the second pixel signal VPIX2 corresponding to the voltage at the first signal node SN1 is sampled. The voltage at the first signal node SN1 during the period from time t10 to time t11 may correspond to an amount of the second photocharges.

As will be described below with reference to FIG. 12, the CDS may be performed based on the reset and image components R1 and S1 of the first pixel signal VPIX1, the reset and image components R2 and S2 of the second pixel signal VPIX2 and the reset and image components R3 and S3 of the third pixel signal VPIX3, respectively, and image data may be generated based on the result of the CDSs. Since the image components S1 and S2 are detected after the reset components R1 and R2 are detected, it may be determined that the unit pixel 100a performs a 4T operation for the first and second pixel signals VPIX1 and VPIX2. Since the reset component R3 is detected after the image component S3 is detected, it may be determined that the unit pixel 100a performs a 3T operation for the third pixel signal VPIX3.

Figure 5:
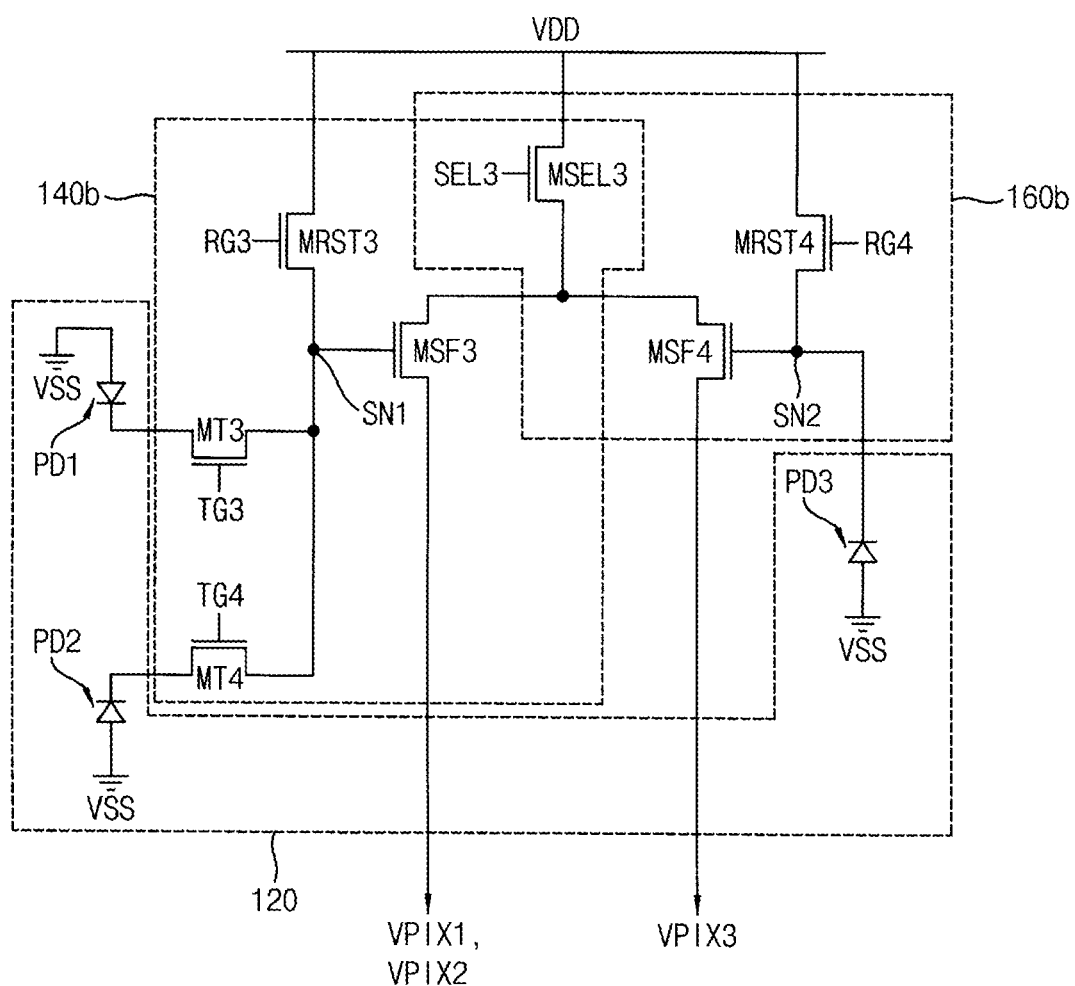
FIG. 5 is a circuit diagram illustrating another example of the unit pixel of FIG. 1.

FIG. 5 is a circuit diagram illustrating another example of the unit pixel of FIG. 1.

Referring to FIG. 5, a unit pixel 100b of a stacked image sensor includes a stacked photoelectric conversion unit 120, a first signal generating unit 140b and a second signal generating unit 160b.

The stacked photoelectric conversion unit 120 includes a first photoelectric conversion element PD1, a second photoelectric conversion element PD2 and a third photoelectric conversion element PD3. The stacked photoelectric conversion unit 120 in FIG. 5 may be substantially the same as the stacked photoelectric conversion unit 120 in FIG. 3.

The first signal generating unit 140b may include a first signal node SN1, a first transfer transistor MT3, a second transfer transistor MT4, a first reset transistor MRST3, a first drive transistor MSF3 and a first selection transistor MSEL3. The second signal generating unit 160b may include a second signal node SN2, a second reset transistor MRST4, a second drive transistor MSF4 and the first selection transistor MSEL3. A configuration of the first signal generating unit 140b may be substantially the same as the 4T structure, and a configuration of the second signal generating unit 160b may be substantially the same as the 3T structure.

In the unit pixel 100b of FIG. 5, the first selection transistor MSEL3 may be shared by the first and second signal generating units 140b and 160b. As will be described below with reference to FIG. 6, outputs of the first, second and third pixel signals VPIX1, VPIX2 and VPIX3 may be controlled based on a row selection signal SEL3 that is applied to a control terminal of the first selection transistor MSEL3.

The first transfer transistor MT3 may be connected between the first photoelectric conversion element PD1 and the first signal node SN1 and may have a control terminal receiving a first transfer signal TG3. The second transfer transistor MT4 may be connected between the second photoelectric conversion element PD2 and the first signal node SN1 and may have a control terminal receiving a second transfer signal TG4. The first reset transistor MRST3 may have a first terminal receiving a power supply signal VDD, a control terminal receiving a first reset signal RG3 and a second terminal connected to the first signal node SN1. The first drive transistor MSF3 may have a first terminal, a control terminal connected to the first signal node SN1 and a second terminal outputting the first and second pixel signals VPIX1 and VPIX2.

The first transfer transistor MT3 may transfer the first photocharges collected by the first photoelectric conversion element PD1 to the first signal node SN1 in response to the first transfer signal TG3. The second transfer transistor MT4 may transfer the second photocharges collected by the second photoelectric conversion element PD2 to the first signal node SN1 in response to the second transfer signal TG4. The first reset transistor MRST3 may reset the first signal node SN1 in response to the first reset signal RG3. The first drive transistor MSF3 may sequentially output the first and second pixel signals VPIX1 and VPIX2 by amplifying the voltage at the first signal node SN1.

The second reset transistor MRST4 may be connected between the power supply voltage VDD and the second signal node SN2 and may have a control terminal receiving a second reset signal RG4. The second drive transistor MSF4 may have a first terminal, a control terminal connected to the second signal node SN2 and a second terminal outputting the third pixel signal VPIX3. The second reset transistor MRST4 may reset the second signal node SN2 in response to the second reset signal RG4. The second drive transistor MSF4 may output the third pixel signal VPIX3 by amplifying the voltage at the second signal node SN2.

The first selection transistor MSEL3 may have a first terminal receiving the power supply signal VDD, the control terminal receiving the row selection signal SEL3 and a second terminal connected to the first terminal of the first drive transistor MSF3 and the first terminal of the second drive transistor MSF4.

The first selection transistor MSEL3 may be selectively turned on in response to the row selection signal SEL3. When the first selection transistor MSEL3 is turned on, the first and second signal generating units 140b and 160b are enabled, and the first, second and third pixel signals VPIX1, VPIX2 and VPIX3 may be sequentially generated and output.

In some example embodiments, the transistors MT3, MT4, MRST3, MSF3, MRST4, MSF4 and MSEL3 included in the first and second signal generating unit 140b and 160b in FIG. 5 may be NMOS transistors. In this case, the first, second and third photocharges collected by the stacked photoelectric conversion unit 120 may be the electrons of the electron-hole pairs.

Figure 6:
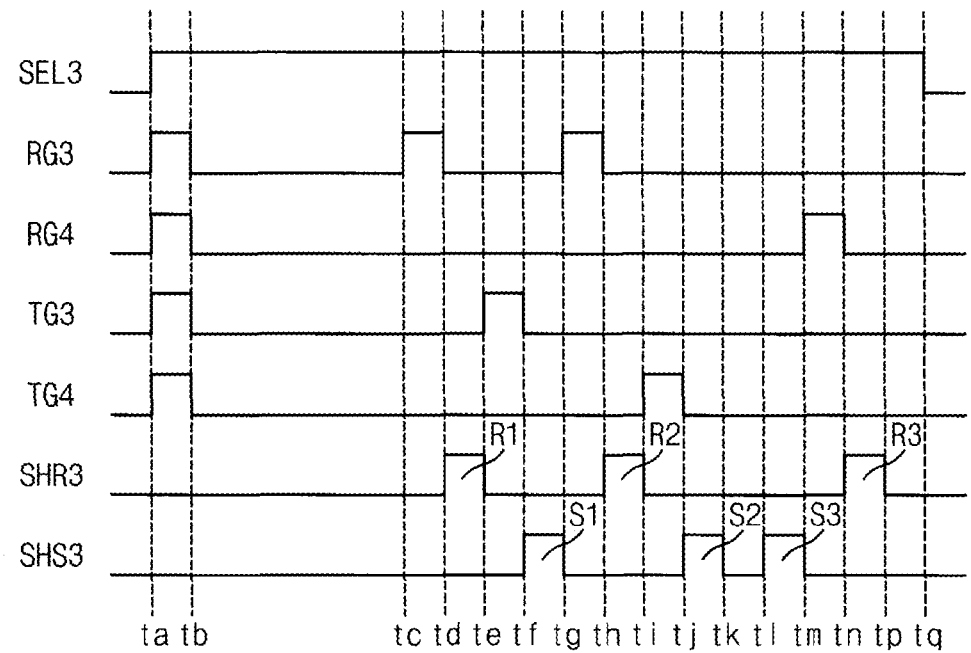
FIGS. 6 and 7 are diagrams for describing an operation of the unit pixel of FIG. 5.
Figure 7:
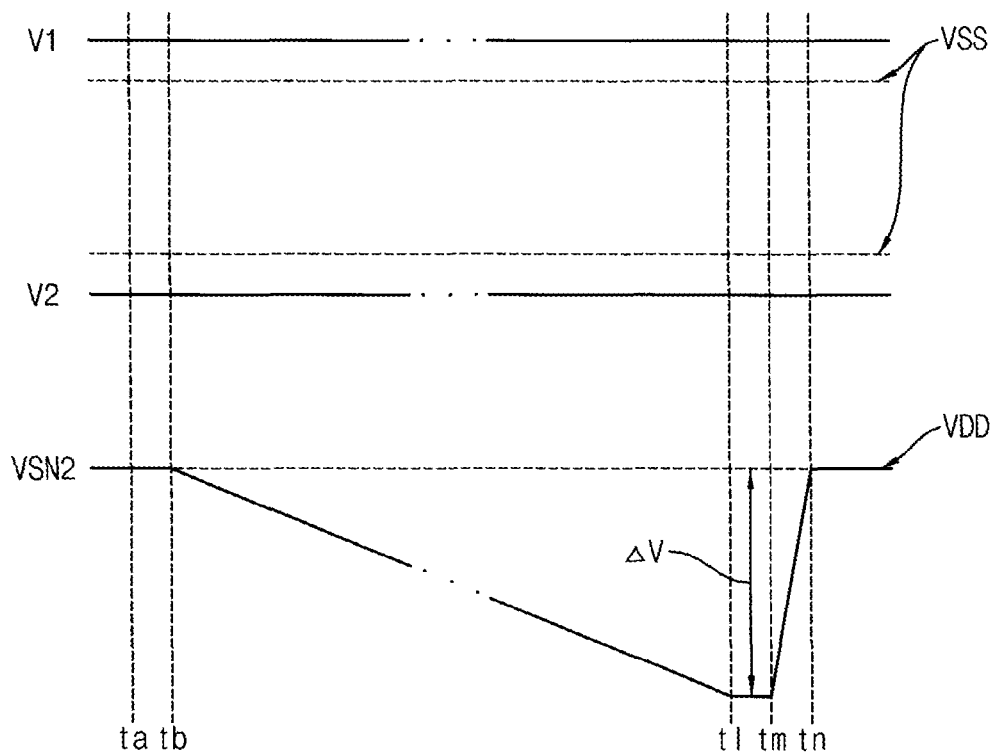

FIGS. 6 and 7 are diagrams for describing an operation of the unit pixel of FIG. 5.

Referring to FIGS. 5 and 6, at time ta, the unit pixel 100b starts to operate in an integration mode. In addition, the row selection signal SEL3 is transitioned from a first logic level (e.g., a logic low level) to a second logic level (e.g., a logic high level), and then the first and second signal generating units 140b and 160b are enabled.

During a period from time ta to time tb, the first and second reset signals RG3 and RG4 and the first and second transfer signals TG3 and TG4 are activated. The first signal node SN1 is reset based on the activated first reset signal RG3, and the second signal node SN2 is reset based on the activated second reset signal RG4.

After time tb, a photoelectric conversion operation is performed based on the incident light. At time tc, the integration mode is finished, and the unit pixel 100b starts to operate in a readout mode.

During a period from time tc to time td, the first reset signal RG3 is activated, and then the first signal node SN1 is reset based on the activated first reset signal RG3.

During a period from time td to time te, a first sampling signal SHR3 is activated, and then a reset component R1 of the first pixel signal VPIX1 corresponding to the voltage at the reset first signal node SN1 is sampled.

During a period from time te to time tf, the first transfer signal TG3 is activated, and then the first photocharges are transferred from the first photoelectric conversion element PD1 to the first signal node SN1.

During a period from time tf to time tg, a second sampling signal SHS3 is activated, and then an image component S1 of the first pixel signal VPIX1 corresponding to the voltage at the first signal node SN1 is sampled. The voltage at the first signal node SN1 during the period from time tf to time tg may correspond to an amount of the first photocharges.

During a period from time tg to time th, the first reset signal RG3 is activated, and then the first signal node SN1 is reset based on the activated first reset signal RG3.

During a period from time th to time ti, the first sampling signal SHR3 is activated, and then a reset component R2 of the second pixel signal VPIX2 corresponding to the voltage at the reset first signal node SN1 is sampled.

During a period from time ti to time tj, the second transfer signal TG4 is activated, and then the second photocharges are transferred from the second photoelectric conversion element PD2 to the first signal node SN1.

During a period from time tj to time tk, the second sampling signal SHS3 is activated, and then an image component S2 of the second pixel signal VPIX2 corresponding to the voltage at the first signal node SN1 is sampled. The voltage at the first signal node SN1 during the period from time tj to time tk may correspond to an amount of the second photocharges.

During a period from time tl to time tm, the second sampling signal SHS3 is activated, and then an image component S3 of the third pixel signal VPIX3 corresponding to the voltage at the second signal node SN2 is sampled. The voltage at the second signal node SN2 during the period from time tl to time tm may correspond to an amount of the third photocharges collected by the third photoelectric conversion element PD3.

During a period from time tm to time tn, the second reset signal RG4 is activated, and then the second signal node SN2 is reset based on the activated second reset signal RG4.

During a period from time tn to time tp, the first sampling signal SHR3 is activated, and then a reset component R3 of the third pixel signal VPIX3 corresponding to the voltage at the reset second signal node SN2 is sampled.

At time tq, the row selection signal SEL3 is transitioned from the second logic level to the first logic level, and then the first and second signal generating units 140b and 160b are disabled.

Although FIG. 6 illustrates that the row selection signal SEL3 is transitioned from the first logic level to the second logic level at time ta and the first and second signal generating units 140b and 160b are enabled at time ta, the row selection signal SEL3 may be transitioned from the first logic level to the second logic level at time tc (e.g., in the readout mode), and then the first and second signal generating units 140b and 160b may be enabled at time tc.

In some example embodiments, as described above with reference to FIGS. 2A, 2B and 2C, the third photoelectric conversion element PD3 in FIG. 5 may be an organic photoelectric conversion element. Referring to FIGS. 5 and 7, to collect electrons of electron-hole pairs, a first voltage V1 applied to a first electrode (e.g., the bottom electrode BE in FIG. 2A) of the third photoelectric conversion element PD3 in FIG. 5 may be a positive voltage, and a second voltage V2 applied to a second electrode (e.g., the top electrode TE in FIG. 2A) of the third photoelectric conversion element PD3 in FIG. 5 may be a negative voltage. During the period from time ta to time tb, the voltage VSN2 at the second signal node SN2 is initialized to a level of the power supply voltage VDD. During a period from time tb to time tl, the third photoelectric conversion element PD3 in FIG. 5 collects the third photocharges (e.g., the electrons), and thus the voltage VSN2 at the second signal node SN2 is gradually decreased from the level of the power supply voltage VDD with a constant slope. During the period from time tl to time tm, the image component S3 of the third pixel signal VPIX3 corresponding to the third photocharges is sampled. During the period from time tm to time tn, the voltage VSN2 at the second signal node SN2 is initialized to the level of the power supply voltage VDD. Effective image data may correspond to a difference $\Delta V$ between a level of the reset component and a level of the image component.

Although FIGS. 3, 4, 5, 6 and 7 illustrate that the first, second and third photocharges collected by the stacked photoelectric conversion unit 120 correspond to the electrons, the unit pixel according to some example embodiments may include the stacked photoelectric conversion unit collecting holes as the first, second and third photocharges. If the stacked photoelectric conversion unit collects the holes as the first, second and third photocharges, transistors included in the first and second signal generating units may be p-type metal oxide semiconductor (PMOS) transistors.

Figure 8:
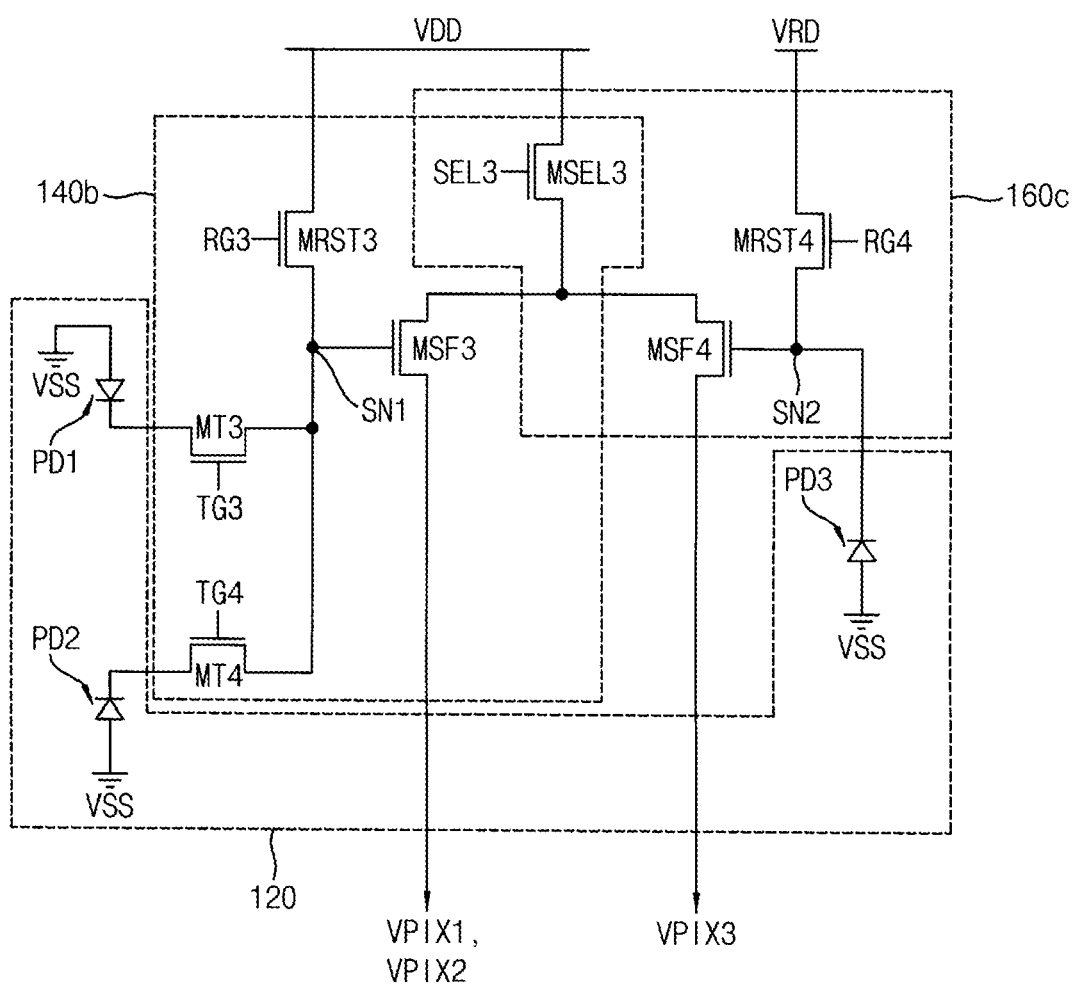
FIG. 8 is a circuit diagram illustrating still another example of the unit pixel of FIG. 1.

FIG. 8 is a circuit diagram illustrating still another example of the unit pixel of FIG. 1.

Referring to FIG. 8, a unit pixel 100c of a stacked image sensor includes a stacked photoelectric conversion unit 120, a first signal generating unit 140b and a second signal generating unit 160c.

The stacked photoelectric conversion unit 120 and the first signal generating unit 140b in FIG. 8 may be substantially the same as the stacked photoelectric conversion unit 120 and the first signal generating unit 140b in FIG. 5, respectively.

The second signal generating unit 160c may include a second signal node SN2, a second reset transistor MRST4, a second drive transistor MSF4 and a first selection transistor MSEL3. In comparison with the second signal generating unit 160b in FIG. 5, a first terminal (e.g., a drain terminal) of the second reset transistor MRST4 and a first terminal (e.g., a drain terminal) of the first selection transistor MSEL3 may be separated from each other in the second signal generating unit 160c in FIG. 8.

The second reset transistor MRST4 may be connected between a drain voltage VRD and the second signal node SN2 and may have a control terminal receiving a second reset signal RG4. The first selection transistor MSEL3 may have the first terminal receiving a power supply signal VDD, a control terminal receiving a row selection signal SEL3 and a second terminal. The second drive transistor MSF4 may have a first terminal connected to the second terminal of the first selection transistor MSEL3, a control terminal connected to the second signal node SN2 and a second terminal outputting a third pixel signal VPIX3.

In some example embodiments, the drain voltage VRD may have a level lower than a level of the power supply signal VDD. In this case, although the first and second photocharges collected by the first and second photoelectric conversion elements PD1 and PD2 in FIG. 8 correspond to electrons of electron-hole pairs and all transistors MT3, MT4, MRST3, MSF3, MRST4, MSF4 and MSEL3 in the first and second signal generating unit 140b and 160c in FIG. 8 are NMOS transistors, the third photocharges collected by the third photoelectric conversion element PD3 in FIG. 8 may correspond to holes of electron-hole pairs.

In some example embodiments, the unit pixel 100c of FIG. 8 may operate based on the timing diagram of FIG. 6. An operation of the unit pixel 100c of FIG. 8 that collects the holes in the third photoelectric conversion element PD3 in FIG. 8 will be described with reference to FIG. 9.

Figure 9:
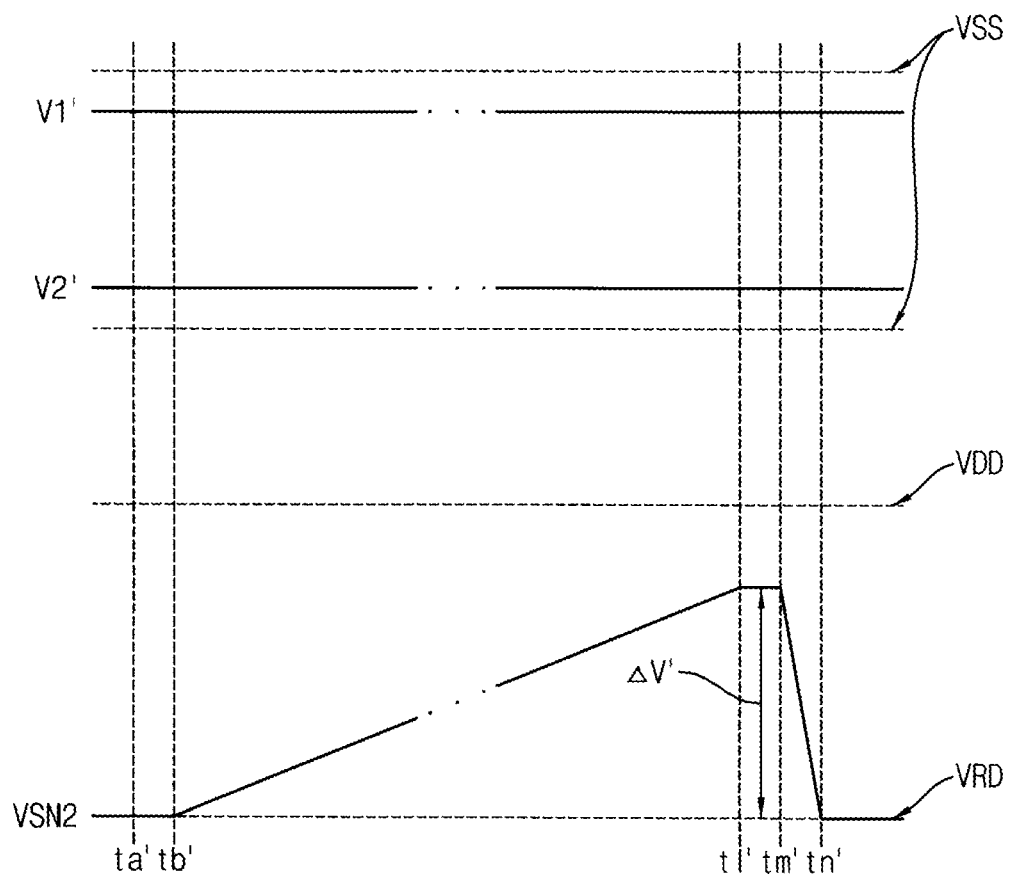
FIG. 9 is a diagram for describing an operation of the unit pixel of FIG. 8.

FIG. 9 is a diagram for describing an operation of the unit pixel of FIG. 8.

In some example embodiments, as described above with reference to FIGS. 2A, 2B and 2C, the third photoelectric conversion element PD3 in FIG. 8 may be an organic photoelectric conversion element. Referring to FIGS. 8 and 9, to collect holes of electron-hole pairs, a first voltage V1' applied to a first electrode (e.g., the bottom electrode BE in FIG. 2A) of the third photoelectric conversion element PD3 in FIG. 8 may be a negative voltage, and a second voltage V2' applied to a second electrode (e.g., the top electrode TE in FIG. 2A) of the third photoelectric conversion element PD3 in FIG. 8 may be a positive voltage. During a period from time ta' to time tb', which corresponds to the period from time ta to time tb in FIGS. 6 and 7, the voltage VSN2 at the second signal node SN2 is initialized to a level of the drain voltage VRD that is lower than the level of the power supply voltage VDD. During a period from time tb' to time t1', which corresponds to the period from time tb to time t1 in FIGS. 6 and 7, the third photoelectric conversion element PD3 in FIG. 8 collects the third photocharges (e.g., the holes), and thus the voltage VSN2 at the second signal node SN2 is gradually increased from the level of the drain voltage VRD with a constant slope. During a period from time t1' to time tm', which corresponds to the period from time t1 to time tm in FIGS. 6 and 7, the image component S3 of the third pixel signal VPIX3 corresponding to the third photocharges is sampled. During a period from time tm' to time tn', which corresponds to the period from time tm to time tn in FIGS. 6 and 7, the voltage VSN2 at the second signal node SN2 is initialized to the level of the drain voltage VRD. Effective image data may correspond to a difference ΔV' between a level of the reset component and a level of the image component. Assuming that only a type of the third photocharges in FIGS. 8 and 9 is different from a type of the third photo charges in FIGS. 5 and 7 and all the other conditions in FIGS. 8 and 9 are substantially the same as all the other conditions in FIGS. 5 and 7, the difference ΔV' in FIG. 9 may be substantially the same as the difference ΔV in FIG. 7.

Figure 10:
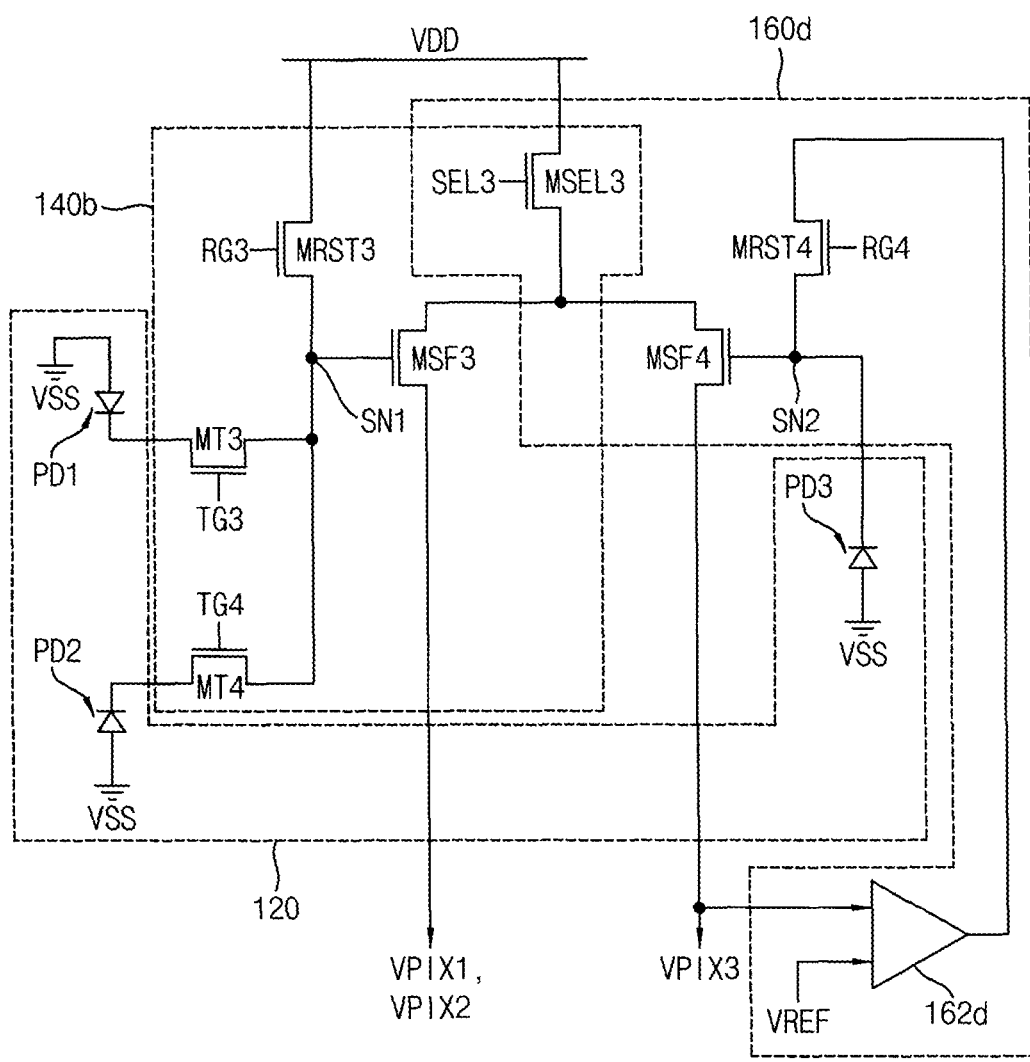
FIGS. 10 and 11 are circuit diagrams illustrating still other examples of the unit pixel of FIG. 1.
Figure 11:
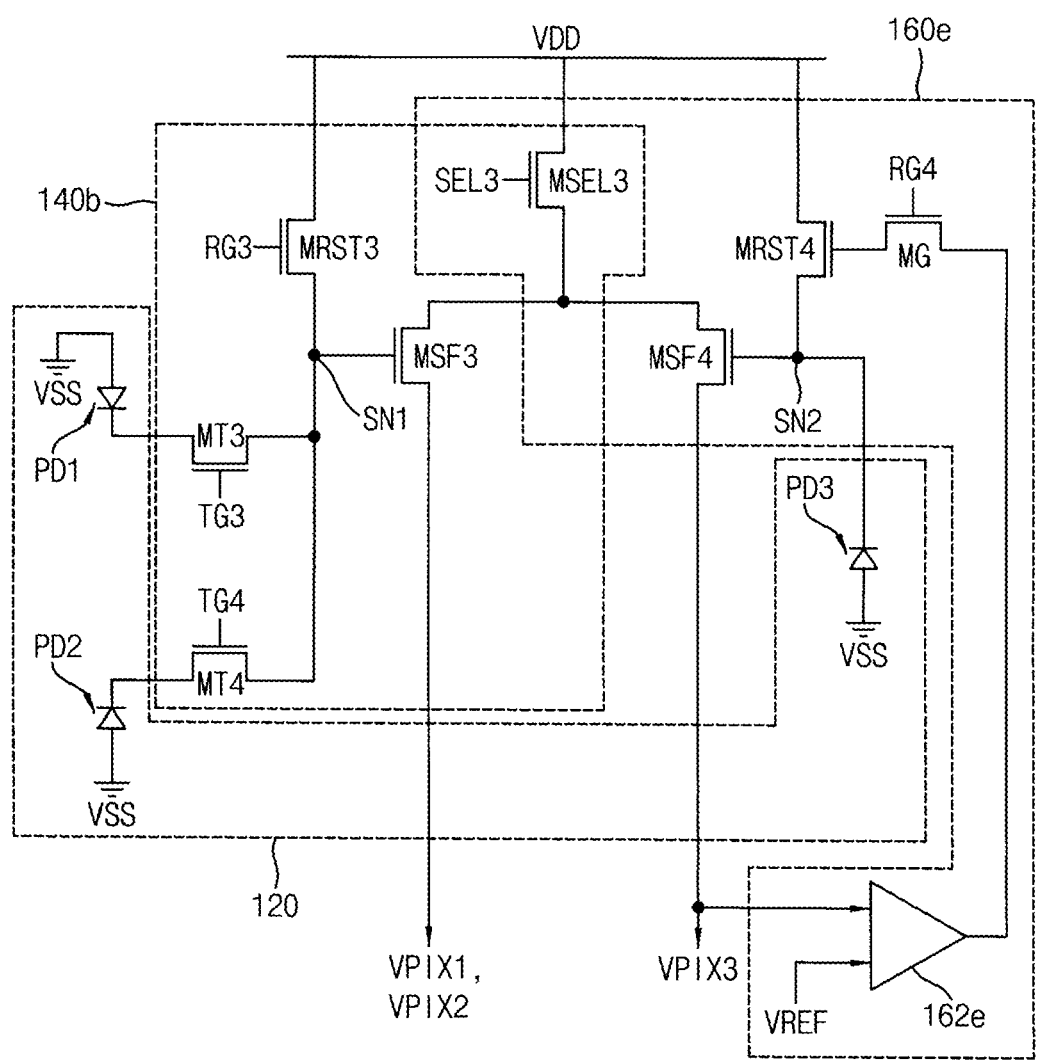

FIGS. 10 and 11 are circuit diagrams illustrating still other examples of the unit pixel of FIG. 1.

Referring to FIG. 10, a unit pixel 100d of a stacked image sensor includes a stacked photoelectric conversion unit 120, a first signal generating unit 140b and a second signal generating unit 160d.

The stacked photoelectric conversion unit 120 and the first signal generating unit 140b in FIG. 10 may be substantially the same as the stacked photoelectric conversion unit 120 and the first signal generating unit 140b in FIG. 5, respectively.

The second signal generating unit 160d may include a second signal node SN2, a second reset transistor MRST4, a second drive transistor MSF4, a first selection transistor MSEL3 and a feedback unit 162d. In comparison with the second signal generating unit 160b in FIG. 5, a first terminal (e.g., a drain terminal) of the second reset transistor MRST4 and a first terminal (e.g., a drain terminal) of the first selection transistor MSEL3 may be separated from each other in the second signal generating unit 160d in FIG. 10. In addition, the second signal generating unit 160d in FIG. 10 may further include the feedback unit 162d connected to the first terminal of the second reset transistor MRST4.

The second reset transistor MRST4 may have the first terminal, a control terminal receiving a second reset signal RG4 and a second terminal connected to the second signal node SN2. The first selection transistor MSEL3 may have the first terminal receiving a power supply signal VDD, a control terminal receiving a row selection signal SEL3 and a second terminal. The second drive transistor MSF4 may have a first terminal connected to the second terminal of the first selection transistor MSEL3, a control terminal connected to the second signal node SN2 and a second terminal outputting a third pixel signal VPIX3. The feedback unit 162d may have a first input terminal receiving the third pixel signal VPIX3, a second input terminal receiving a reference signal VREF and an output terminal connected to the first terminal of the second reset transistor MRST4.

Referring to FIG. 11, a unit pixel 100e of a stacked image sensor includes a stacked photoelectric conversion unit 120, a first signal generating unit 140b and a second signal generating unit 160e.

The stacked photoelectric conversion unit 120 and the first signal generating unit 140b in FIG. 11 may be substantially the same as the stacked photoelectric conversion unit 120 and the first signal generating unit 140b in FIG. 5, respectively.

The second signal generating unit 160e may include a second signal node SN2, a second reset transistor MRST4, a second drive transistor MSF4, a first selection transistor MSEL3, a feedback unit 162e and a first transistor MG. In comparison with the second signal generating unit 160b in FIG. 5, the second signal generating unit 160e in FIG. 11 may further include the first transistor MG and the feedback unit 162e connected to a control terminal (e.g., a gate terminal) of the second reset transistor MRST4.

The second reset transistor MRST4 may have a first terminal receiving a power supply signal VDD, the control terminal and a second terminal connected to the second signal node SN2. The first selection transistor MSEL3 may have the first terminal receiving the power supply signal VDD, a control terminal receiving a row selection signal SEL3 and a second terminal. The second drive transistor MSF4 may have a first terminal connected to the second terminal of the first selection transistor MSEL3, a control terminal connected to the second signal node SN2 and a second terminal outputting a third pixel signal VPIX3. The feedback unit 162e may have a first input terminal receiving the third pixel signal VPIX3, a second input terminal receiving a reference signal VREF and an output terminal. The first transistor MG may have a first terminal connected to the control terminal of the second reset transistor MRST4, a control terminal receiving a second reset signal RG4 and a second terminal connected to the output terminal of the feedback unit 162e. The first transistor MG may selectively connect the output terminal of the feedback unit 162e with the control terminal of the second reset transistor MRST4 in response to the second reset signal RG4.

In some example embodiments, each of the feedback unit 162d in FIG. 10 and the feedback unit 162e in FIG. 11 may be a column-wise feedback circuit. The unit pixel 100d of FIG. 10 and the unit pixel 10e of FIG. 11 may operate based on the timing diagram of FIG. 6.

Figure 12:
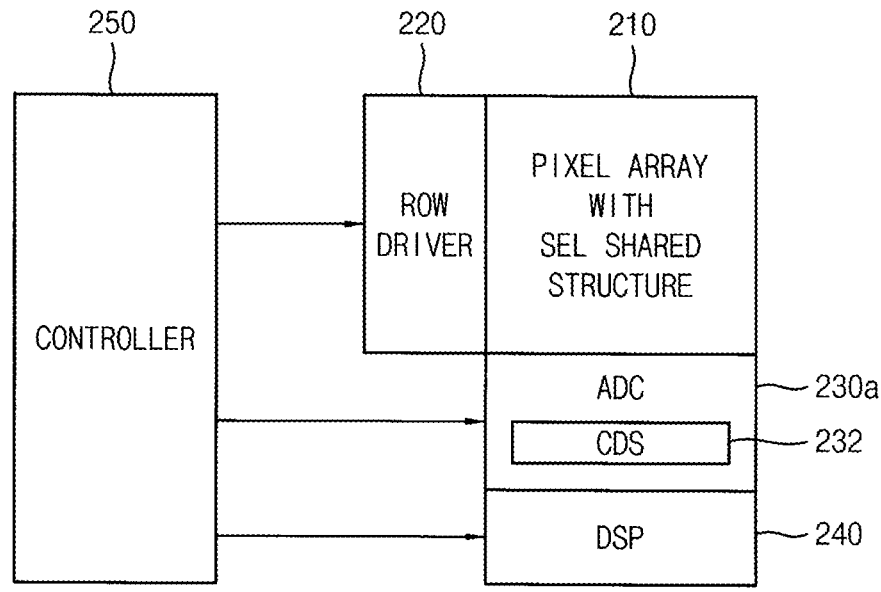
FIGS. 12 and 13 are block diagrams illustrating stacked image sensors including a unit pixel according to some example embodiments.
Figure 13:
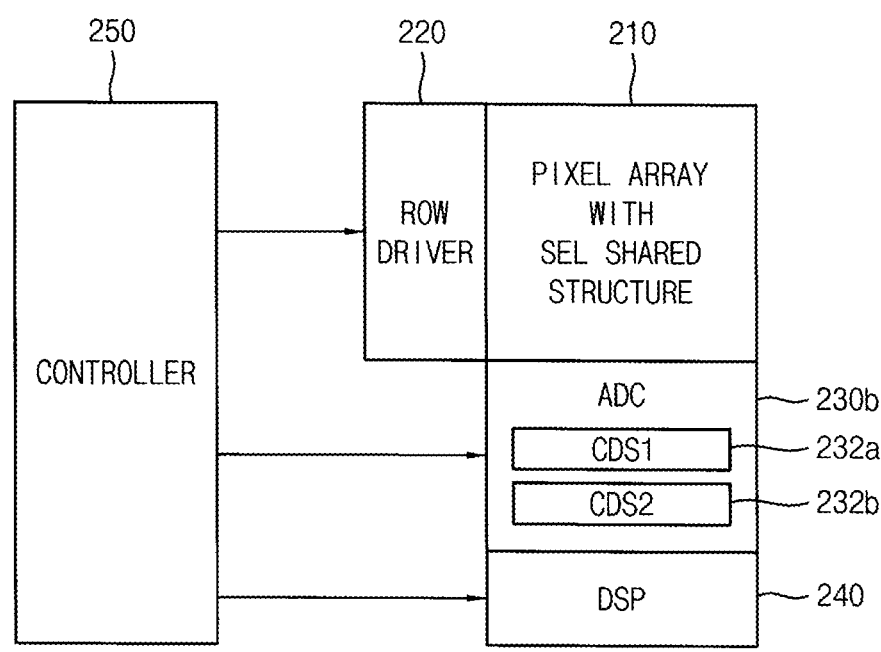

FIGS. 12 and 13 are block diagrams illustrating stacked image sensors including a unit pixel according to some example embodiments.

Referring to FIG. 12, a stacked image sensor 200a includes a pixel array 210 and a signal processing unit. The signal processing unit may include a row driver 220, an analog-todigital converting (ADC) unit 230*a*, a digital signal processing (DSP) unit 240 and a controller 250.

The pixel array 210 generates a plurality of pixel signals (e.g., analog pixel signals) based on incident light. The pixel array 210 includes a plurality of unit pixels that are arranged in a matrix of a plurality of rows and a plurality of columns. Each unit pixel may be the unit pixel 100 of FIG. 1 and may be implemented with examples described above with reference to FIGS. 3, 5, 8, 10 and 11. In other words, each unit pixel may include a stacked photoelectric conversion unit, a first signal generating unit and a second signal generating unit. The first signal generating unit may perform the 4T operation based on some photocharges collected from the stacked photoelectric conversion unit, the second signal generating unit may perform the 3T operation based on the other photocharges collected from the stacked photoelectric conversion unit, and at least a portion of the second signal generating unit may be shared by the first signal generating unit. Accordingly, each unit pixel may have a relatively great fill factor, and the stacked image sensor 200*a* including the plurality of unit pixels may have relatively high light guiding efficiency and light sensitivity.

The signal processing unit generates image data (e.g., effective digital image data) based on the plurality of pixel signals.

The row driver 220 may be connected with each row of the pixel array 210. The row driver 220 may generate driving signals to drive each row. For example, the row driver 220 may drive the plurality of unit pixels included in the pixel array 210 row by row.

The ADC unit 230*a* may be connected with each column of the pixel array 210. The ADC unit 230*a* may convert analog signals (e.g., the pixel signals) output from the pixel array 210 into digital signals (e.g., the image data). In some example embodiments, the ADC unit 230*a* may perform a column analog-to-digital conversion that converts the analog signals in parallel (e.g., simultaneously or concurrently) using a plurality of analog-to-digital converters respectively coupled to the plurality of columns. In other example embodiments, the ADC unit 230*a* may perform a single analog-to-digital conversion that sequentially converts the analog signals using a single analog-to-digital converter.

According to some example embodiments, the ADC unit 230*a* may further include a single correlated double sampling (CDS) unit 232 for extracting an effective signal component. In some example embodiments, the CDS unit 232 may perform an analog double sampling that extracts the effective signal component based on a difference between an analog reset signal including a reset component and an analog data signal including a signal component. In other example embodiments, the CDS unit 232 may perform a digital double sampling that converts the analog reset signal and the analog data signal into two digital signals and extracts the effective signal component based on a difference between the two digital signals. In still other example embodiments, the CDS unit 232 may perform a dual correlated double sampling that performs both the analog double sampling and the digital double sampling. The CDS unit 232 may sequentially perform a CDS on the first, second and third pixel signals VPIX1, VPIX2 and VPIX3 in FIG. 1 based on the reset components R1, R2 and R3 and the image components S1, S2 and S3 in FIG. 6.

The DSP unit 240 may receive the digital signals output from the ADC unit 230*a*, and may perform an image data processing on the digital signals. For example, the DSP unit 240 may perform image interpolation, color correction, white balance, gamma correction, color conversion, etc.

The controller 250 may control the row driver 220, the ADC unit 230*a* and the DSP unit 240 by providing control signals, such as a clock signal, a timing control signal, or the like. According to some example embodiments, the controller 250 may include a control logic circuit, a phase locked loop circuit, a timing control circuit, a communication interface circuit, or the like.

Referring to FIG. 13, a stacked image sensor 200*b* includes a pixel array 210 and a signal processing unit. The signal processing unit may include a row driver 220, an ADC unit 230*b*, a DSP unit 240 and a controller 250.

The pixel array 210, the row driver 220, the DSP unit 240 and the controller 250 in FIG. 13 may be substantially the same as the pixel array 210, the row driver 220, the DSP unit 240 and the controller 250 in FIG. 12, respectively.

The ADC unit 230*b* may be connected with each column of the pixel array 210. The ADC unit 230*b* may convert analog signals (e.g., the pixel signals) output from the pixel array 210 into digital signals (e.g., the image data). According to some example embodiments, the ADC unit 230*b* may further include two CDS units 232*a* and 232*b* for extracting an effective signal component. The CDS unit 232*a* may sequentially perform a CDS on the first and second pixel signals VPIX1 and VPIX2 in FIG. 1 based on the reset components R1 and R2 and the image components S1 and S2 in FIG. 4. The CDS unit 232*b* may perform the CDS on the third pixel signal VPIX3 in FIG. 1 based on the reset component R3 and the image component S3 in FIG. 4.

Figure 14:
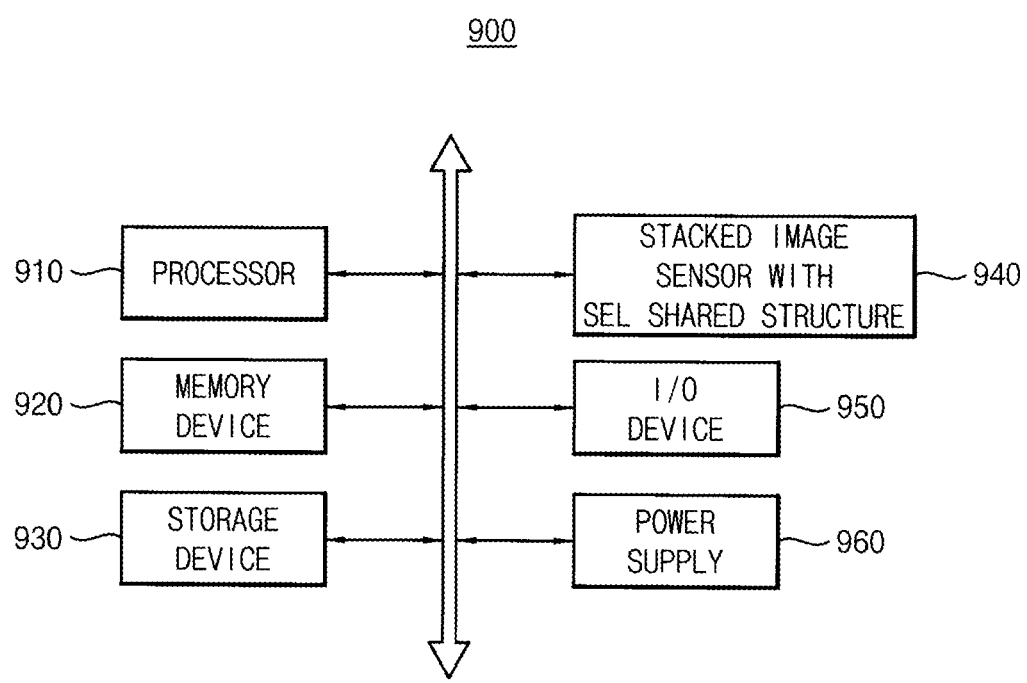
FIG. 14 is a block diagram illustrating a computing system including a stacked image sensor according to some example embodiments.

FIG. 14 is a block diagram illustrating a computing system including a stacked image sensor according to some example embodiments.

Referring to FIG. 14, a computing system 900 may include a processor 910, a memory device 920, a storage device 930, a stacked image sensor 940, an input/output (I/O) device 950 and a power supply 960. Although not illustrated in FIG. 14, the computing system 900 may further include ports that communicate with a video card, a sound card, a memory card, a universal serial bus (USB) device, or other electronic devices.

The processor 910 may perform various calculations or tasks. According to some example embodiments, the processor 910 may be a microprocessor or a central processing unit (CPU). The processor 910 may communicate with the memory device 920, the storage device 930 and the I/O device 950 via an address bus, a control bus, and/or a data bus. In some example embodiments, the processor 910 may be coupled to an extended bus, such as a peripheral component interconnection (PCI) bus.

The memory device 920 may store data for operating the computing system 900. For example, the memory device 920 may be implemented with at least one volatile memory device, e.g., a dynamic random access memory (DRAM) device, a static random access memory (SRAM) device, etc., and/or at least one nonvolatile memory device, e.g., an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

The storage device 930 may include a solid state drive (SSD), a hard disk drive (HDD), a CD-ROM, etc. The I/O device 950 may include an input device (e.g., a keyboard, a keypad, a mouse, etc.) and an output device (e.g., a printer, a display device, etc.). The power supply 960 may supply operation voltages for the computing system 900.

The stacked image sensor 940 may communicate with the processor 910 via the bus or other communication links. The stacked image sensor 940 may be one of the stacked image sensor 200a of FIG. 12 and the stacked image sensor 200b of FIG. 13 and may include a plurality of unit pixels. Each unit pixel may be the unit pixel 100 of FIG. 1 and may be implemented with examples described above with reference to FIGS. 3, 5, 8, 10 and 11. In other words, each unit pixel may include a stacked photoelectric conversion unit, a first signal generating unit and a second signal generating unit. The first signal generating unit may perform the 4T operation based on some photocharges collected from the stacked photoelectric conversion unit, the second signal generating unit may perform the 3T operation based on the other photocharges collected from the stacked photoelectric conversion unit, and at least a portion of the second signal generating unit may be shared by the first signal generating unit. Accordingly, each unit pixel may have a relatively great fill factor, and the stacked image sensor 940 including the plurality of unit pixels may have relatively high light guiding efficiency and light sensitivity.

The stacked image sensor 940 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

In some example embodiments, the stacked image sensor 940 and the processor 910 may be fabricated as one integrated circuit chip. In other example embodiments, the stacked image sensor 940 and the processor 910 may be fabricated as two separate integrated circuit chips.

The computing system 900 may be any computing system using a stacked image sensor. For example, the computing system 900 may include a digital camera, a mobile phone, a smart phone, a portable multimedia player (PMP), a personal digital assistant (PDA), a personal computer, a server computer, a workstation, a laptop computer, a tablet computer, a digital television, a set-top box, a music player, a portable game console, a navigation system, etc.

FIG. 15 is a block diagram illustrating an example of an interface employable in the computing system of FIG. 14.

Referring to FIG. 15, a computing system 1000 may be implemented by a data processing device that uses or supports a mobile industry processor interface (MIPI) interface. The computing system 1000 may include an application processor 1110, a stacked image sensor 1140, a display device 1150, etc.

A camera serial interface (CSI) host 1112 of the application processor 1110 may perform a serial communication with a CSI device 1141 of the stacked image sensor 1140 via a CSI. In some example embodiments, the CSI host 1112 may include a deserializer (DES), and the CSI device 1141 may include a serializer (SER). A display serial interface (DSI) host 1111 of the application processor 1110 may perform a serial communication with a DSI device 1151 of the display device 1150 via a DSI. In some example embodiments, the DSI host 1111 may include a serializer (SER), and the DSI device 1151 may include a deserializer (DES).

The computing system 1000 may further include a radio frequency (RF) chip 1160 performing a communication with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications of the PHY 1161. The RF chip 1160 may further include a DigRF SLAVE 1162 that is controlled through the DigRF MASTER 1114.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1210, a wireless local area network (WLAN) 1220, a worldwide interoperability for microwave access (WIMAX) 1230, etc. However, the structure and the interface of the computing system 1000 are not limited thereto.

The above described embodiments may be applied to a stacked image sensor and an electronic system having the stacked image sensor. For example, the electronic system may be a system using the stacked image sensor, e.g., a computer, a digital camera, a 3D camera, a cellular phone, a PDA, a scanner, a navigation system, a video phone, a surveillance system, an auto-focusing system, a tracking system, a motion-sensing system and/or an image-stabilization system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A unit pixel of a stacked image sensor comprising:
    a stacked photoelectric conversion unit including a first photoelectric conversion element, a second photoelectric conversion element and a third photoelectric conversion element stacked on each other, the first photoelectric conversion element collecting first photocharges based on a first component of incident light, the second photoelectric conversion element collecting second photocharges based on a second component of the incident light, the third photoelectric conversion element collecting third photocharges based on a third component of the incident light;
    a first signal generating unit configured to generate a first pixel signal based on the first photocharges and a first signal node, and configured to generate a second pixel signal based on the second photocharges and the first signal node; and
    a second signal generating unit configured to generate a third pixel signal based on the third photocharges and a second signal node, at least a portion of the second signal generating unit being shared by the first signal generating unit.

2. The unit pixel of claim 1, wherein the first signal generating unit includes a first transfer transistor, a second transfer transistor, a first reset transistor and a first drive transistor, and the second signal generating unit includes a second reset transistor, a second drive transistor and a selection transistor,
wherein a row selection signal is commonly applied to a first terminal of the first reset transistor and a control terminal of the selection transistor, and outputs of the first, second and third pixel signals are controlled based on the row selection signal.

3. The unit pixel of claim 2, wherein the first transfer transistor transfers the first photocharges to the first signal node in response to a first transfer signal, the second transfer transistor transfers the second photocharges to the first signal node in response to a second transfer signal, the first reset transistor resets the first signal node in response to a first reset signal and the row selection signal, and the first drive transistor outputs the first and second pixel signals by amplifying a voltage at the first signal node,
wherein the second reset transistor resets the second signal node in response to a second reset signal, the second drive transistor amplifies a voltage at the second signal node, and the selection transistor outputs the third pixel signal based on the amplified voltage at the second signal node and the row selection signal.

4. The unit pixel of claim 1, wherein a selection transistor is shared by the first and second signal generating units, and the selection transistor controls outputs of the first, second and third pixel signals based on a row selection signal applied to a control terminal of the selection transistor.

5. The unit pixel of claim 4, wherein the first signal generating unit includes a first transfer transistor, a second transfer transistor, a first reset transistor and a first drive transistor, and the second signal generating unit includes a second reset transistor and a second drive transistor.

6. The unit pixel of claim 5, wherein the selection transistor is selectively turned on in response to the row selection signal, the first transfer transistor transfers the first photocharges to the first signal node in response to a first transfer signal, the second transfer transistor transfers the second photocharges to the first signal node in response to a second transfer signal, the first reset transistor resets the first signal node in response to a first reset signal, and the first drive transistor outputs the first and second pixel signals by amplifying a voltage at the first signal node when the selection transistor is turned on,
wherein the second reset transistor resets the second signal node in response to a second reset signal, and the second drive transistor outputs the third pixel signal by amplifying a voltage at the second signal node when the selection transistor is turned on.

7. The unit pixel of claim 5, wherein the first and second photocharges correspond to electrons of electron-hole pairs, and the third photocharges correspond to holes of the electron-hole pairs.

8. The unit pixel of claim 7, wherein the third photoelectric conversion element is an organic photoelectric conversion element that includes a first electrode, an organic photoelectric conversion layer on the first electrode and a second electrode on the organic photoelectric conversion layer,
wherein a negative voltage is applied to the first electrode, a positive voltage is applied to the second electrode, a power supply voltage is applied to a first terminal of the first reset transistor and a first terminal of the selection transistor, and a voltage lower than the power supply voltage is applied to a first terminal of the second reset transistor.

9. The unit pixel of claim 5, wherein the first, second and third photocharges correspond to electrons of electron-hole pairs,
wherein the third photoelectric conversion element is an organic photoelectric conversion element that includes a first electrode, an organic photoelectric conversion layer on the first electrode and a second electrode on the organic photoelectric conversion layer,
wherein a positive voltage is applied to the first electrode, a negative voltage is applied to the second electrode, and a power supply voltage is applied to a first terminal of the first reset transistor, a first terminal of the selection transistor, and a first terminal of the second reset transistor.

10. The unit pixel of claim 5, wherein the second signal generating unit further includes:
a feedback unit having a first input terminal receiving the third pixel signal, a second input terminal receiving a reference signal and an output terminal connected to a first terminal of the second reset transistor.

11. The unit pixel of claim 5, wherein the second signal generating unit further includes:
a feedback unit having a first input terminal receiving the third pixel signal, a second input terminal receiving a reference signal and an output terminal; and
a first transistor selectively connecting the output terminal of the feedback unit with a control terminal of the second reset transistor.

12. The unit pixel of claim 1, wherein the first signal generating unit generates the first and second pixel signals by amplifying a voltage at the first signal node, the first signal node is selectively connected to one of the first and second photoelectric conversion elements through a respective one of first and second transfer transistors,
wherein the second signal generating unit generates the third pixel signal by amplifying a voltage at the second signal node, the second signal node is directly connected to the third photoelectric conversion element.

13. The unit pixel of claim 1, wherein the first and second photoelectric conversion elements are within a semiconductor substrate, and the third photoelectric conversion element is formed over the semiconductor substrate.

14. The unit pixel of claim 1, wherein the first component of the incident light is a red component, the second component of the incident light is a blue component, and the third component of the incident light is a green component.

15. A unit pixel of a stacked image sensor comprising:
a stacked photoelectric conversion unit configured to independently collect first photocharges, second photocharges and third photocharges based on different components of incident light;
a first signal generating unit including a first signal node and structures sequentially transferring the first and second photocharges to the first signal node, the first signal generating unit configured to generate a first pixel signal based on the first photocharges transferred to the first signal node and configured to generate a second pixel signal based on the second photocharges transferred to the first signal node; and
a second signal generating unit including a second signal node directly receiving the third photocharges, the second signal generating unit configured to generate a third pixel signal based on the third photocharges and the second signal node,
wherein a configuration of activating the unit pixel based on a row selection signal is shared by the first and second signal generating units.

16. The unit pixel of claim 1, wherein the first signal generating unit includes a reset transistor resetting the first signal node, and the second signal generating unit includes a selection transistor outputting the third pixel signal, wherein the row selection signal is commonly applied to a first terminal of the reset transistor and a control terminal of the selection transistor.

17. The unit pixel of claim 1, further comprising:

a selection transistor having a control terminal receiving the row selection signal and sequentially outputting the first, second and third pixel signals based on the row selection signal, wherein the selection transistor is shared by the first and second signal generating units.

18. A stacked image sensor comprising:

a pixel array including a plurality of unit pixels, the pixel array configured to generate a plurality of pixel signals based on incident light;

a signal processing unit configured to generate image data based on the plurality of pixel signals, wherein each of the plurality of unit pixels includes:

a stacked photoelectric conversion unit including a first photoelectric conversion element, a second photoelectric conversion element and a third photoelectric conversion element stacked on each other, the first photoelectric conversion element collecting first photocharges based on a first component of the incident light, the second photoelectric conversion element collecting second photocharges based on a second component of the incident light, the third photoelectric conversion element collecting third photocharges based on a third component of the incident light;

a first signal generating unit configured to generate a first pixel signal based on the first photocharges and a first signal node, and configured to generate a second pixel signal based on the second photocharges and the first signal node; and a second signal generating unit configured to generate a third pixel signal based on the third photocharges and a second signal node, at least a portion of the second signal generating unit being shared by the first signal generating unit.

19. The stacked image sensor of claim 18, wherein the signal processing unit includes an analog-to-digital converting (ADC) unit that performs an ADC on the plurality of pixel signals, wherein the ADC unit includes:

a correlated double sampling (CDS) unit configured to sequentially perform a CDS on the first, second and third pixel signals.

20. The stacked image sensor of claim 18, wherein the signal processing unit includes an ADC unit that performs an ADC on the plurality of pixel signals, wherein the ADC unit includes:

a first CDS unit configured to sequentially perform a CDS on the first and second pixel signals; and a second CDS unit configured to perform the CDS on the third pixel signal.

\* \* \* \* \*